(12) United States Patent
Jiang et al.

(10) Patent No.: US 11,451,231 B2
(45) Date of Patent: Sep. 20, 2022

(54) ROBUST QUANTUM LOGICAL GATES

(71) Applicant: Yale University, New Haven, CT (US)

(72) Inventors: Liang Jiang, Guilford, CT (US);
Steven M. Girvin, Hamden, CT (US);
Brian Lester, New Haven, CT (US);
Yvonne Gao, Singapore (SG); Robert J. Schoelkopf, III, Madison, CT (US)

(73) Assignee: Yale University, New Haven, CT (US)

( * ) Notice: Subject to any disclaimer, the term of this patent is extended or adjusted under 35 U.S.C. 154(b) by 259 days.

(21) Appl. No.: 16/959,184

(22) PCT Filed: Jan. 5, 2019

(86) PCT No.: PCT/US2019/012440
§ 371 (c)(1),
(2) Date: Jun. 30, 2020

(87) PCT Pub. No.: WO2019/156759
PCT Pub. Date: Aug. 15, 2019

(65) Prior Publication Data
US 2020/0412369 A1    Dec. 31, 2020

Related U.S. Application Data

(60) Provisional application No. 62/733,326, filed on Sep. 19, 2018, provisional application No. 62/613,937, filed on Jan. 5, 2018.

(51) Int. Cl.
*H03K 19/195*     (2006.01)
*G06N 10/00*     (2022.01)
(Continued)

(52) U.S. Cl.
CPC .......... *H03K 19/195* (2013.01); *G06N 10/00* (2019.01); *H01P 5/18* (2013.01); *B82Y 10/00* (2013.01)

(58) Field of Classification Search
CPC ...... H03K 19/195; G06N 10/00; G06N 99/00; H01P 5/18; B82Y 10/00; H01L 39/223; H01L 39/22
See application file for complete search history.

(56) References Cited

U.S. PATENT DOCUMENTS

| 6,578,018 B1 | 6/2003 | Ulyanov |
| 6,635,898 B2 | 10/2003 | Williams et al. |

(Continued)

FOREIGN PATENT DOCUMENTS

| CN | 1991558 A | 7/2007 |
| CN | 101076957 A | 11/2007 |

(Continued)

OTHER PUBLICATIONS

U.S. Appl. No. 15/553,047, filed Aug. 23, 2017, Jiang et al.
(Continued)

*Primary Examiner* — Jung Kim
(74) *Attorney, Agent, or Firm* — Wolf, Greenfield & Sacks, P.C.

(57) ABSTRACT

Techniques for implementing robust quantum logic gates are provided and described. In some aspects, a quantum logic gate between a plurality of cavities comprising a first cavity and a second cavity is implemented by performing a first beam splitter operation between the first cavity and the second cavity using a coupling transmon that is dispersively coupled to both the first cavity and the second cavity, and performing a controlled phase shift operation between the second cavity and an ancilla transmon that is dispersively coupled to the second cavity but not dispersively coupled to the first cavity.

20 Claims, 7 Drawing Sheets

(51) Int. Cl.
*H01P 5/18* (2006.01)
*B82Y 10/00* (2011.01)

(56) References Cited

U.S. PATENT DOCUMENTS

| | | | |
|---|---|---|---|
| 6,943,368 | B2 | 9/2005 | Amin et al. |
| 7,230,266 | B2 | 6/2007 | Hilton et al. |
| 7,498,832 | B2 | 3/2009 | Baumgardner et al. |
| 7,899,092 | B2 | 3/2011 | Malinovsky |
| 8,106,717 | B2 | 1/2012 | Ichimura et al. |
| 8,138,784 | B2 | 3/2012 | Przybysz et al. |
| 8,242,799 | B2 | 8/2012 | Pesetski et al. |
| 8,508,280 | B2 | 8/2013 | Naaman et al. |
| 8,514,478 | B1 | 8/2013 | Spence |
| 10,540,602 | B2 | 1/2020 | Heeres et al. |
| 10,776,709 | B2 | 9/2020 | Shen et al. |
| 11,106,991 | B2 | 8/2021 | Jiang et al. |
| 2002/0188578 | A1 | 12/2002 | Amin et al. |
| 2004/0109631 | A1 | 6/2004 | Franson et al. |
| 2004/0119061 | A1 | 6/2004 | Wu et al. |
| 2004/0200949 | A1 | 10/2004 | Beausoleil et al. |
| 2005/0240311 | A1 | 10/2005 | Rabitz |
| 2006/0017992 | A1 | 1/2006 | Beausoleil, Jr. et al. |
| 2006/0056631 | A1 | 3/2006 | Beausoleil et al. |
| 2009/0033369 | A1 | 2/2009 | Baumgardner et al. |
| 2012/0002968 | A1 | 1/2012 | Luo et al. |
| 2012/0319085 | A1 | 12/2012 | Gambetta et al. |
| 2012/0319684 | A1 | 12/2012 | Gambetta et al. |
| 2013/0196855 | A1 | 8/2013 | Poletto et al. |
| 2013/0308956 | A1 | 11/2013 | Meyers et al. |
| 2014/0266406 | A1 | 9/2014 | Abraham et al. |
| 2014/0314419 | A1* | 10/2014 | Paik ............... H04B 10/70 398/115 |
| 2015/0263736 | A1 | 9/2015 | Herr et al. |
| 2016/0077168 | A1 | 3/2016 | Teklemariam et al. |
| 2016/0233965 | A1 | 8/2016 | Medford |
| 2016/0308502 | A1 | 10/2016 | Abdo et al. |
| 2016/0328659 | A1 | 11/2016 | Mohseni et al. |
| 2016/0364653 | A1 | 12/2016 | Chow et al. |
| 2017/0018312 | A1 | 1/2017 | Benjamin et al. |
| 2017/0076787 | A1 | 3/2017 | Frank |
| 2017/0193388 | A1 | 7/2017 | Filipp et al. |
| 2017/0201224 | A1 | 7/2017 | Strong et al. |
| 2018/0032895 | A1 | 2/2018 | Jiang et al. |
| 2018/0247217 | A1 | 8/2018 | Heeres et al. |
| 2019/0087743 | A1 | 3/2019 | Heeres et al. |
| 2019/0266512 | A1 | 8/2019 | Shen et al. |

FOREIGN PATENT DOCUMENTS

| | | |
|---|---|---|
| CN | 101990742 A | 3/2011 |
| CN | 102210908 A | 10/2011 |
| CN | 102593694 A | 7/2012 |
| CN | 103582949 A | 2/2014 |
| CN | 103998965 A | 8/2014 |
| EP | 2 797 038 A2 | 10/2014 |
| JP | 2007-524815 A | 8/2007 |
| JP | 2018-511848 A | 4/2018 |
| WO | WO 2008/140290 A2 | 11/2008 |
| WO | WO 2016/138378 A1 | 9/2016 |
| WO | WO 2016/138399 A1 | 9/2016 |

OTHER PUBLICATIONS

U.S. Appl. No. 15/747,260, filed Jan. 24, 2018, Heeres.
Andersson et al., Binary search trees for generalized measurements. Phys. Rev. A. May 6, 2008;77(5):052104-1-5.
Barreiro et al., An Open-System Quantum Simulator with Trapped Ions. Nature. Feb. 24, 2011;470:486-91.
Beige et al., Quantum Computing Using Dissipation to Remain in a Decoherence-Free Subspace. Phys. Rev. Lett. Aug. 21, 2000;85(8):1762-5.
Bianchetti et al., Dynamics of dispersive single qubit read-out in circuit quantum electrodynamics. Phys. Rev. A. Oct. 30, 2009;80(4):043840-1-7.
Blais et al., Cavity quantum electrodynamics for superconducting electrical circuits:An architecture for quantum computation. Phys. Rev. A. Jun. 29, 2004;69(6):06320-1-14.
Brattke et al., Generation of Photon Number States on Demand via Cavity Quantum Electrodynamics. Phys. Rev. Lett. Apr. 16, 2001;86(16):3534-7.
Braunstein et al., Quantum information with continuous variables. Rev. Mod. Phys. Apr. 2005;77, 513-77.
Burgath et al., Non-Abelian phases from quantum Zeno dynamics. Phys. Rev. A. Oct. 9, 2013;88(4), 042107-1-5.
Cacheffo et al., Quasi-perfect state transfer in a bosonic dissipative network. J. Phys. B:At. Mol. Opt. Phys. May 5, 2010;43(10):105503.
Cafaro et al., Quantum stabilizer codes embedding qubits into qudits. Phys. Rev. A. Aug. 2012;86(2):022308.
Carollo et al., Coherent quantum evolution via reservoir driven holonomy. Phys. Rev. Lett. Jan. 20, 2006;96(2):020403-1-4.
Carollo et al., Geometric phase induced by a cyclically evolving squeezed vacuum reservoir. Phys. Rev. Lett. Apr. 21, 2006;96(15):150403-1-4.
Chaturvedi et al., Berry's phase for coherent states. J. Phys. A:Math. Gen. Nov. 11, 1987;20(16):L1071-5.
Choi, Completely positive linear maps on complex matrices. Linear Algebra and Its Applications. Jun. 1, 1975;10(3):285-90.
Dasgupta et al., Decoherence-induced geometric phase in a multi-level atomic system. J. Phys. B:At. Mol. Opt. Phys. May 14, 2007;40(9):S127.
De Oliveira et al., Properties of displaced number states. Phys. Rev. A. Mar. 1, 1990;41(5):2645-52.
De Ponte et al., Relaxation- and decoherence-free subspaces in networks of weakly and strongly coupled resonators. Ann. Phys. Sep. 2007;322(9):2077-84.
De Ponte et al., State protection under collective damping and diffusion. Phys. Rev. A. Jul. 26, 2011;84(1):012331-1-5.
De Ponte et al., Storing quantum states in bosonic dissipative networks. J. Phys. B:At. Mol. Opt. Phys. Nov. 14, 2008;41(21):215506.
Deléglise et al., Reconstruction of non-classical cavity field states with snapshots of their decoherence. Nature. Sep. 25, 2008;455(7212):510-4.
Devoret et al., Superconducting Circuits for Quantum Information:An Outlook. Science. Mar. 8, 2013;339(6124):1169-74.
Divincenzo, Quantum Computation. Science. Oct. 13, 1995;270(5234):255-61.
Dodonov et al., Even and Odd Coherent States and Excitations of a Singular Oscillator. Physica. Mar. 15, 1974;72(3):597-615.
Duan et al., Preserving coherence in quantum computation by pairing the quantum bits. Phys. Rev. Lett. Sep. 8, 1997;79(10):1953-6.
Facchi et al., Quantum Zeno Subspaces. Physical Review Letters. Aug. 19, 2002;89(8):080404-1-4.
Feng et al., Geometric Entangling Gates in Decoherence-Free Subspaces with Minimal Requirements. Phys. Rev Lett. Nov. 13, 2009;103(20):200501-1-4.
Fouquieres et al., Second order gradient ascent pulse engeineering. J. Mag. Res. Oct. 2011;212(2):412-7.
Gambetta et al., Qubit-photon intereactions in a cavity:Measurement-induced dephasing and number splitting. Phys. Rev. A. Oct. 17, 2006;74(4):042318-1-14.
Gorini et al., Completely positive dynamical semigroups of N-level systems. J. Math. Phys. May 1976;17(5):821-5.
Gottesman et al., Encoding a qubit in an oscillator. Phys. Rev. A. Jul. 2001;64(1):012310-1-21.
Heeres et al., Cavity State Manipulation Using Photon-Number Selective Phase Gates. Phys Rev Lett Sep. 25, 2015;115(13):137002-1-5. arXiv:1503.01496v1.
Hofheinz et al., Generation of Fock states in a superconducting quantum circuit. Nature. Jul. 17, 2008;454(7202):310-4.
Hofheinz et al., Synthesizing arbitrary quantum states in a superconducting resonator. Nature. May 28, 2009;459(7246):546-9.
Houck et al., Generating single microwave photons in a circuit. Nature. Sep. 20, 2007;449(7160):328-31.

(56) References Cited

OTHER PUBLICATIONS

Johnson et al., Quantum non-demolition detection of single microwave photons in a circuit. Nature Phys. Jun. 20, 2010;6:663-7.
Kapit, Error-Transparent Quantum Gates for Small Logical Qubit Architectures. Physical Review Letters. Feb. 1, 2018;120(5):050503-1-5.
Kempe et al., Theory of decoherence-free fault-tolerant universal quantum computation. Phys. Rev. A. Apr. 2001;63(4):042307-1-29.
Kirchmair et al., Observation of quantum state collapse and revival due to the single-photon Kerr effect. Nature. Mar. 14, 2013;495(7440):205-9.
Knill et al., Theory of Quantum Error Correction for General Noise. Phys. Rev, Lett. Mar. 13, 2000;84(11):2525-8.
Krastanov et al., Universal Control of an Oscillator with Dispersive Coupling to a Qubit. Phys. Rev. A. Oct. 21, 2015;92(4):040303-1-5.
Lanyon et al., Universal Digital Quantum Simulation with Trapped Ions. Science. Oct. 7, 2011;334(6052):57-61.
Law et al., Arbitrary Control of a Quantum Electromagnetic Field. Phys. Rev. Lett. Feb. 12,1996;76(7):1055-8.
Leek et al., Observation of Berry's Phase in a Solid-State Qubit. Science. Dec. 21, 2007;318(5858):1889-92.
Leghtas et al., Confining the state of light to a quantum manifold by engineered two-photon loss. Science. Feb. 20, 2015;347(6224):853-7.
Leghtas et al., Deterministic protocol for mapping a qubit to coherent state superpositions in a cavity. Phys. Rev. A. Apr. 15, 2013;87(4):042315-1-7.
Leghtas et al., Hardware-Efficient Autonomous Quantum Memory Protection. Phys Rev Lett. Sep. 20, 2013;111(12):120501-1-5.
Leibfried et al., Quantum dynamics of single trapped ions. Rev. Mod. Phys. Jan. 2003;75(1):281-324.
Liang et al., Nonadiabatic holonomic quantum computation in decoherence-free subspaces with trapped ions. Phys. Rev. A. Jun. 10, 2014;89(6):062312-1-5.
Lidar et al., Decoherence Free Subspaces for Quantum Computation. Phys. Rev. Lett. Sep. 21, 1998;81(12):2594-7.
Lindblad, On the Generators of Quantum Dynamical Semigroups. Commun. Math. Phys. Jun. 1976;48(2):119-30.
Liu et al., Optical selection rules and phase-dependant adiabatic state control in superconducting quantum circuit. Physical reveiw letters. Aug. 17, 2005;95(8):087001.
Llyod et al., Engineering quantum dynamics. Phys Rev A. Dec. 10, 2001;65(1):010101.
Llyod et al., Quantum Computation over Continuous Variables. Phys. Rev. Lett. Feb. 22, 1999;82(8):1784-7.
Michael et al., New Class of Quantum Error-Correcting Codes for Bosonic Mode, Phys. Rev. X. Jul.-Sep. 2016:6(3):031006-1-26.
Mirrahimi et al., Dynamically protected cat-qubits:a new paradigm for universal quantum computation. New Journal of Physics. Apr. 2014;16(4):045014. doi:10.1088/1367-2630/16/4/045014. 30 pages.
Mischuck et al., Qudit quantum computation in the Jaynes-Cumming model. Phys. Rev. A. Feb. 2013;87(2):022341-1-14.
Mousolou et al., Universal non-adiabatic holonomic gates in quantum dots and single-molecule magnets. New J. Phys. Jan. 17, 2014;16:013029.
Neto et al., From decoherence-free channels to decoherence-free and quasi-free subspaces within bosonic dissipative networks. J. Phys. B:At. Mol. Opt. Phys. Jul. 5, 2011;44(14):145502.
Nigg et al., Quantum computations on a topologically encoded qubit. Science. Jul. 18, 2014;345(6194):302-5.
Ofek et al., Extending the lifetime of a quantum bit with error correction in superconducting circuits. Nature. Aug. 2016;536(7617):441.
Oreshkov et al., Adiabatic Markovian Dynamics. Phys. Rev. Lett. Jul. 30, 2010;105(5):050503.
Oreshkov et al., Fault-Tolerant Holonomic Quantum Computation. Phys. Rev. Lett. Feb. 20, 2009;102(7):070502-1-4.
Osaki et al., Derivation and physical interpretation of the optimum detection operators for coherent-state signals. Phys. Rev. A. Aug. 1996:54(2):1691-1701.

Pachos et al., Decoherence-free dynamical and geometrical entangling phase gates. Phys. Rev. A Mar. 26, 2004;69(3):033817-1-9.
Palomaki et al., Coherent state transfer between itinerant microwave fields and a mechanical oscillator. Nature. Mar. 14, 2013. 495(7440):210-4.
Paz-Silva et al., Zeno effect for quantum computation and control. Physical Review Letters. Feb. 24, 2012;108(8):080501-1-5.
Poyatos et al., Quantum Reservoir Engineering with Laser Cooled Trapped Ions. Phys. Rev. Lett. Dec. 2, 1996;77(23):4728-31.
Reagor et al., Reaching 10 ms single photon lifetimes for superconducting aluminum cavities. Appl. Phys. Lett. May 13, 2013:102(19):192604.
Recati et al., Holonomic quantum computation with neutral atoms. Physical Review A. Sep. 17, 2002;66(3):032309-1-13. doi:10.1103/PHYSREVA.66.032309. 14 pages.
Reiserer et al., A quantum gate between a flying optical photon and a single trapped atom. Nature. Apr. 10, 2014;508(7495):237-40.
Rosenblum et al., Fault-tolerant measurement of a quantum error syndrome. Science. Jul. 20, 2018;361(6399):266-70.
Salathe et al., Digital Quantum Simulation of Spin Models with Circuit Quantum Electrodynamics. Phys. Rev. X 5. Apr.-Jun. 2015;5(2):021027-1-12.
Sarandy et al., Abelian and non-Abelian geometric phases in adiabatic open quantum systems. Phys. Rev. A. Jun. 5, 2006;73(6):062101-1-10.
Schindler et al., Quantum simulation of open-system dynamical maps with trapped ions. Nat. Phys. May 19, 2013;9:361-7.
Schoelkopf et al., Wiring up quantum systems. Nature. Feb. 7, 2008;451(7179):664-9.
Schuster et al., Resolving photon number states in a superconducting circuit. Nature Letters. Feb. 1, 2007;445:515-8.
Shankar et al., Autonomously stabilized entanglement between two superconduction quantum bits. Nature. Dec. 19, 2013;504(7480):419-22.
Shen et al., Quantum channel construction with circuit quantum electrodynamics. Phys Rev B. Apr. 1, 2017;95(13):134501-1-14. arXiv:1611.03463.
Signoles et al., Confined quantum Zeno dynamics of a watched atomic arrow. Nature Phys. Oct. 2014;10:715-9.
Sjöqvist, A new phase in quantum computation. Physics. Nov. 17, 2008;1:35.
Slichter et al., Measurement-induced qubit state mixing in circuit QED from up-converted dephasing noise. Physical Review Letters. Oct. 9, 2012;109(15):153601.
Smolin et al., Efficient Method for Computing the Maximum-Likelihood Quantum State from Measurements with Additive Gaussian Noise. Phys. Rev. Lett. Feb. 17, 2012;108(7):070502-1-4.
Tiecke et al., Nanophotonic quantums phase switch with a single atom. Nature. Apr. 10, 2014;508(7495):241-4.
Vlastakis et al., Deterministically Encoding Quantum Information Using 100-Photon Schrodinger Cat States. Science. Nov. 1, 2013;342(6158):607-10.
Vourdas, Quantum systems with finite Hilbert space. Rep. Prog. Phys. Mar. 2004:67(3):267-320.
Wallraff et al., Strong coupling of a single photon to a superconductiong qubit using circuit quantum electrodynamics. Nature. Sep. 9, 2004;431(7005):162-7.
Wendin et al., Superconducting quantum circuits, qubits and computing. arXiv preprint cond-mat/0508729. Aug. 30, 2005. http://qudev.phys.ethz.ch/content/courses/QSIT08/pdfs/WendinReview.pdf, 60 paes.
Whitney et al., Automated generation of layout and control for quantum circuits. CF '07 Proceedings of the 4th International Conference on Computing Frontiers. May 7-9, 2007:83-94.
Wilczek et al., Appearance of Gauge Structure in Simple Dynamical Systems. Phys. Rev. Lett. Jun. 10, 1984;52(24):2111-4.
Wu et al., Holonomic Quantum Computation in Decoherence-Free Subspaces. Phys. Rev. Lett. Sep. 25, 2005:95(13):130501-1-4.
Wu et al., Time-dependent Decoherence-Free Subspace. J. Phys. A:Math. Theor. Oct. 12, 2012;45(40):405305-1-7.
Xu et al., Non-Adiabatic Holonomic Quantum Computation in Decoherence-Free Subspaces. Phys. Rev, Lett. Oct. 26, 2012;109(17):170501-1-5.

(56) References Cited

OTHER PUBLICATIONS

Xu et al., Universal Nonadiabatic Geometric Gates in Two-Qubit Decoherence-Free Subspaces. Sci. Rep. Oct. 29, 2014;4:6814.

Yin et al., Implementation of holonomic quantum computation through engineering and manipulating environment. Physical Review A. Dec. 18, 2007;76(6):062311-1-5. doi:10.1103/Physreva.76.062311.

Zanardi et al., Coherent quantum dynamics in steady-state manifolds of strongly dissipative systems. Phys. Rev. Lett. Dec. 12, 2014;113(24):240406-1-5.

Zanardi et al., Geometry, robustness, and emerging unitarity in dissipation-projected dynamics. Phys. Rev. A. May 26, 2015;91(5):052324-1-8.

Zanardi et al., Holonomic Quantum Computation. Phys. Lett. A. Dec. 20, 1999;264(2-3), 94-9.

Zanardi et al., Noiseless Quantum Codes. Phys. Rev. Lett. Oct. 27, 1997;79(17):3306-9.

Zanardi, Stablizing Quantum Information. Phys. Rev. A. Jan. 2001;63(1):012301-1-4.

Zanardi, Virtual Quatum Subsytems. Phys. Rev. Lett. Aug. 13, 2001;87(7):077901-1-4.

Zhang et al., Physical implementation of holonomic quantum computation in decoherence-free subspaces with trapped ions. Phys. Rev. A. Sep. 13, 2006;74(3):034302-1-4.

Zhang et al., Quantum computation in noiseless subsystems with fast non-Abelian holonomies. Phys. Rev. A. Apr. 2014;89(4):042302-1-6.

Zheng, Dissipation-induced geometric phase for an atom trapped in an optical vacity. Phys. Rev. A. May 10, 2012;85(5):052106-1-5.

Zheng, Open-system geometric phase based on system-reservoir joint state evolution. Phys. Rev. A. Jun. 27, 2014;89(6):062118-1-6.

Zhu et al., Geometric quantum gates robust against stochastic control errors. Phys. Rev. A. Aug. 15, 2005;72(2):020301-1-4.

Zueco et al., Qubit-oscillator dynamics in the dispersive regime: analytical theory beyond rotating wave appoximation. Physical Review A. Sep. 30, 2009:80(3):033846-1-5.

Egger, Optimal control and quantum simulations in superconducting quantum devices. Universitat des Saarlandes Dissertation. Oct. 31, 2014:1-157.

Fisher et al., Optimal control of circuit quantum electrodynamics in one and two dimensions. Physical Review B. Feb. 23, 2010;81(8):085328.

Koch et al., Charge-insensitive qubit design derived from the Cooper pair box. Physical Review A. Oct. 12, 2007;76(4):042319.

Sheldon et al., Procedure for systematically tuning up cross-talk in the cross-resonance gate. Physical Review A. Jun. 24, 2016;93(6):060302.

Extended European Search Report for European Application No. 19751562.0, dated Aug. 17, 2021.

Gao et al., Entanglement of bosonic modes through an engineered exchange interaction. Nature. Feb. 27, 2019:566:509-12.

Lau et al., Universal quantum computing with arbitrary continuous-variable encoding. Physical review letters. Aug. 31, 2016;117(10):100501.

Patel et al., A quantum Fredkin gate. Science advances. Mar. 1, 2016;2(3):e1501531.

Rosenblum et al., A CNOT gate between multiphoton qubits encoded in two cavities. Nature communications. Feb. 13, 2018;9(1):1-6.

\* cited by examiner

ROBUST QUANTUM LOGICAL GATES

CROSS REFERENCE TO RELATED APPLICATIONS

This application is a National Phase entry of PCT Application No. PCT/US2019/012440, filed on Jan. 5, 2019, which claims the benefit under 35 U.S.C. § 119(e) of U.S. Provisional Patent Application No. 62/613,937 filed Jan. 5, 2018, titled "ROBUST QUANTUM LOGICAL GATES," and U.S. Provisional Patent Application No. 62/733,326 filed Sep. 19, 2018, titled "ROBUST QUANTUM LOGICAL GATES," which are each incorporated by reference herein in their entirety.

FEDERALLY SPONSORED RESEARCH

This invention was made with government support under W911NF-14-1-0011 awarded by the United States Army Research Office. The government has certain rights in the invention.

BACKGROUND

Quantum information processing uses quantum mechanical phenomena, such as energy quantization, superposition, and entanglement, to encode and process information in a way not utilized by conventional information processing. For example, it is known that certain computational problems may be solved more efficiently using quantum computation rather than conventional classical computation. However, to become a viable computational option, quantum computation requires the ability to precisely control a large number of quantum bits, known as "qubits," and the interactions between these qubits. In particular, qubits should have long coherence times, be able to be individually manipulated, be able to interact with one or more other qubits to implement multi-qubit gates, be able to be initialized and measured efficiently, and be scalable to large numbers of qubits.

A qubit may be formed from any physical quantum mechanical system with at least two orthogonal states. The two states of the system used to encode information are referred to as the "computational basis." For example, photon polarization, electron spin, and nuclear spin are two-level systems that may encode information and may therefore be used as a qubit for quantum information processing. Different physical implementations of qubits have different advantages and disadvantages. For example, photon polarization benefits from long coherence times and simple single qubit manipulation, but suffers from the inability to create simple multi-qubit gates.

Different types of superconducting qubits using Josephson junctions have been proposed, including "phase qubits," where the computational basis is the quantized energy states of Cooper pairs in a Josephson Junction; "flux qubits," where the computational basis is the direction of circulating current flow in a superconducting loop; and "charge qubits," where the computational basis is the presence or absence of a Cooper pair on a superconducting island. Superconducting qubits are an advantageous choice of qubit because the coupling between two qubits is strong making two-qubit gates relatively simple to implement, and superconducting qubits are scalable because they are mesoscopic components that may be formed using conventional electronic circuitry techniques. Additionally, superconducting qubits exhibit excellent quantum coherence and a strong non-linearity associated with the Josephson effect. All superconducting qubit designs use at least one Josephson junction as a non-linear non-dissipative element.

SUMMARY

According to some aspects, a method is provided for implementing a quantum logic gate between a plurality of cavities comprising a first cavity and a second cavity, the method comprising: performing a first beam splitter (BS) operation between the first cavity and the second cavity using a coupling transmon that is dispersively coupled to both the first cavity and the second cavity; and performing a controlled phase shift (CPS) operation between the second cavity and an ancilla transmon that is dispersively coupled to the second cavity but not dispersively coupled to the first cavity.

According to some embodiments, the method further comprises performing a second BS operation between the first cavity and the second cavity using the coupling transmon, wherein the first BS operation is performed before the CPS operation and the second BS operation is performed after the CPS operation.

According to some embodiments, the quantum logic gate comprises a controlled-SWAP (c-SWAP) operation.

According to some embodiments, the quantum logic gate comprises an exponential-SWAP (e-SWAP) gate and the method comprises: performing a first c-SWAP operation between the first cavity and the second cavity; performing a second c-SWAP operation between the first cavity and the second cavity; and performing a rotation operation on the ancilla transmon between the first c-SWAP operation and the second c-SWAP operation.

According to some embodiments, the quantum logic gate comprises an exponential-SWAP (e-SWAP) gate, the CPS operation is a first CPS operation and the method comprises: performing a second CPS operation between the second cavity and the ancilla transmon after the first CPS operation and before the second BS operation; and performing a rotation operation on the ancilla transmon between the first CPS operation and the second CPS operation.

According to some embodiments, the method further comprises: performing a first Hadamard operation before the first CPS operation and after the first BS operation; and performing a second Hadamard operation after the second CPS operation and before the second BS operation.

According to some embodiments, the method further comprises measuring the ancilla transmon.

According to some embodiments, the method further comprises determining that a dephasing error a dephasing error occurred based on a result of measuring the ancilla transmon.

According to some embodiments, at least four energy levels of the ancilla transmon are used; a first energy level of the ancilla transmon is associated with a first decay error type; a second energy level of the ancilla transmon is associated with a second decay error type; and the method further comprises correcting for decay errors based on a result of measuring the ancilla transmon.

According to some embodiments, at least one local quantum logic gate is performed on the ancilla transmon before and/or after the CPS operation.

According to some embodiments, the at least one local quantum logic gate comprises a first Hadamard operation performed after the BS operation and before the CPS operation; and the method further comprises measuring the state of the ancilla transmon to compare the a first quantum state of the first cavity to a second quantum state of the second cavity.

According to some embodiments, the plurality of cavities further comprises a third cavity and a fourth cavity; the coupling transmon is a first coupling transmon; the ancilla transmon is dispersively coupled to the third cavity by not dispersively coupled to the fourth cavity; the CPS operation is a first CPS operation; and the method further comprises: performing a third BS operation between the third cavity and the fourth cavity using a second coupling transmon that is dispersively coupled to both the third cavity and the fourth cavity; and performing a second CPS operation between the third cavity and the ancilla transmon.

According to some embodiments, the method further comprises: performing a fourth BS operation between the third cavity and the fourth cavity using the second coupling transmon, wherein the fourth BS operation is performed before the second CPS operation and the second BS operation is performed after the second CPS operation; performing a third CPS operation between the third cavity and the ancilla transmon after the second CPS operation and before the fourth BS operation; performing a rotation operation on the ancilla transmon between the second CPS operation and the third CPS operation; and performing a fourth CPS operation between the second cavity and the ancilla transmon after the third CPS operation and before the second BS operation.

According to some embodiments, the method further comprises: performing a first Hadamard operation before the first CPS operation and after the first and third BS operations; and performing a second Hadamard operation after the fourth CPS operation and before the second and fourth BS operations.

According to some aspects, a multi-cavity quantum information system is provided comprising: a first cavity configured to support microwave radiation; a second cavity configured to support microwave radiation; a first transmon dispersively coupled to the first cavity; a second transmon dispersively coupled to the second cavity; a third transmon dispersively coupled to both the first cavity and the second cavity; and a microwave source configured to: apply microwave radiation to the third transmon to implement beam splitter operations between the first cavity and the second cavity and transmon rotation operations, and apply microwave radiation to the first transmon and the second transmon to implement controlled phase shift operations on the first cavity and the second cavity, respectively.

According to some embodiments, the microwave source is further configured to apply microwave radiation to the first transmon and the second transmon to implement arbitrary rotation operation on the first transmon and the second transmon, respectively.

According to some embodiments, the microwave source is further configured to apply microwave radiation to the first, second and third transmon to implement a set of universal quantum gates between the first cavity and the second cavity.

According to some embodiments, the microwave source is further configured to apply microwave radiation to the first, second and third transmon to implement a controlled-SWAP gate between the first cavity and the second cavity.

According to some embodiments, the microwave source is further configured to apply microwave radiation to the first, second and third transmon to implement an exponential-SWAP gate between the first cavity and the second cavity.

According to some embodiments, the microwave source is further configured to: apply microwave radiation to the first and/or second transmon to measure the first and/or second transmon; and apply microwave radiation to the first, second, and/or third transmon to implement a quantum gate based on a result of measuring the first and/or second transmon.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1A:
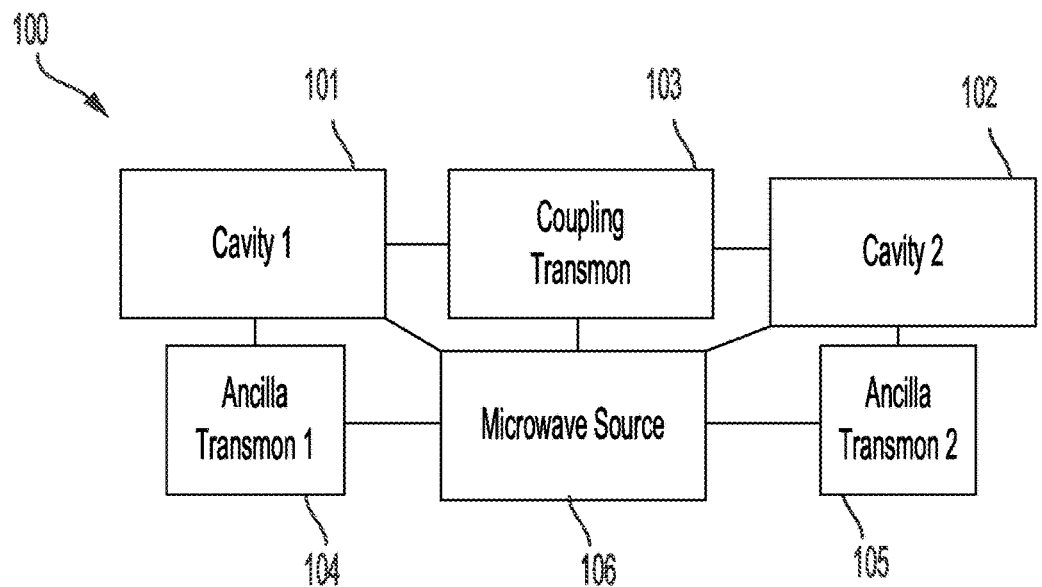
FIG. 1A is a schematic diagram of a multi-cavity quantum information system, according to some embodiments.

In conventional approaches to quantum information processing with superconducting circuits, the information is stored in Josephson-junction based qubits (e.g., transmons) coupled together via exchange of microwave photons in bus resonators or via direct capacitive coupling. The inventors have recognized and appreciated that a different and complementary architecture in which the quantum information is stored and manipulated in microwave photon states of high-Q resonators with transmons acting as ancillae to give universal quantum control of the photonic qubits has significant advantages over the conventional approaches. First, coherence times of microwave cavities are longer than coherence times of superconducting qubits. For example, three-dimensional superconducting microwave cavities can achieve extremely high quality factors approaching 109 in aluminum, and still higher in niobium, with cavity coherence times for aluminum cavities exceeding that of the transmon by two orders of magnitude. Second, the number of states in which information can be encoded is larger in a microwave cavity than in a superconducting qubit. For example, the higher excitation levels of the cavity mode expand the available Hilbert space so that a single cavity mode can be used to encode quantum bits of information in a manner compatible with quantum error correction against various imperfections, including cavity dephasing, excitation loss or thermal heating.

The inventors recognized and appreciated that these advantages of using microwave cavities can be utilized in a unique approach to quantum information processing where quantum information is stored in the quantum state of a microwave cavity while using the transmon as an ancilla to assist quantum information processing and quantum error correction. This 'photonic qubit' approach is the reverse of the conventional approach in which quantum information is stored in the transmons and microwave photon modes are used as quantum busses to couple the transmons. The resulting superconducting cavity-transmon system allows universal quantum control over the cavity mode, quantum error correction reaching the break-even point, joint parity measurement over two cavities, and deterministic coupling gates between the cavities assisted by a transmon controller.

The inventors have further recognized and appreciated that the superconducting cavity-transmon system may encounter limited fidelity of quantum operations, due to the transmon decoherence during the cavity-transmon coupling. The inventors have recognized and appreciated that, besides experimentally improving the coherence properties of the transmon, the fidelity of quantum operations can be improved by implementing robust approaches to suppress or even actively correct the errors due to the decoherence from transmon and other Josephson nonlinear devices.

The inventors have further recognized and appreciated that the universal set of quantum logic gates are "encoding agnostic," meaning no matter how the quantum information is chosen to be logically encoded in the quantum state of the cavity (e.g., cat state encoding, coherent state encoding, Fock state encoding, etc.), the set of quantum logic gates remains universal. Moreover, the hardware used to implement the universal set of quantum logic gates remains the same, independent of the chosen encoding scheme.

According to some embodiments, multiple microwave cavities are controlled and/or coupled together using one or more Josephson nonlinear devices such as a transmons. In some embodiments, a coupling transmon is used to perform operations between two cavities. Examples of such operations include beam splitter (BS) operations that couple the quantum state of a first cavity to the quantum state of a second cavity and vice versa. These operations are referred to as beam splitter operations because they play the same role and implement the same unitary operation as beam splitters do in linear optics quantum computation (LOQC) schemes.

In some embodiments, an ancilla transmon that is coupled to a single cavity is used to implement controlled phase shift (CPS) operations between the single cavity and the transmon. In some embodiments, the ancilla transmon may also be controlled to implement rotations on the quantum state of the ancilla transmon itself.

The inventors have recognized and appreciated that the BS operations, CPS operations, and rotations of the ancilla transmon are sufficient to implement universal gate based quantum computation. In some embodiments, the above operations are used to implement c-SWAP and/or e-SWAP gates. The e-SWAP gate couples cavity modes while preserving the bosonic code space. In this way, entangling operations between bosonic modes can be achieved regardless of the logical encoding used. Some embodiments utilize a robust design of the e-SWAP gate that can herald imperfections due to transmon decoherence. Some embodiments utilized the c-SWAP and e-SWAP gates for one or more applications, such as quantum routers, quantum random access memory (RAM), quantum principle component analysis, and gate-based universal quantum computation.

It is noted that, while a transmon superconducting qubit is described herein as a component of multiple embodiments, other types of superconducting devices may be used in some embodiments.

FIG. 1 is a schematic diagram of a multi-cavity quantum information system 100, according to some embodiments. The multi-cavity quantum information system 100 includes a first cavity 101, a second cavity 102, a coupling transmon 103, a first ancilla transmon 104, a second ancilla transmon 105 and a microwave source 106. While only two cavities and two ancilla transmon are shown in the example system 100 of FIG. 1, other embodiment may include additional cavities and transmons.

The first cavity 101 and the second cavity 102 may be any type of cavity that supports quantum states of microwave radiation. For example, in some embodiments, the first cavity 101 and the second cavity 102 may be a transmission line resonator or a three-dimensional cavity formed from a superconducting material, such as aluminum.

The coupling transmon 103 may be a transmon that is dispersively coupled to both the first cavity 101 and the second cavity 102. The coupling transmon 103 provides an interaction between the quantum states of the two cavities, allowing for interactions such as BS interactions to be performed between the first cavity 101 and the second cavity 102.

The first ancilla transmon 104 and the second ancilla transmon 105 are dispersively coupled to the first cavity 101 and the second cavity 102, respectively. Each ancilla transmon is coupled to a single cavity of the system 100 and not to any other cavity used to store quantum information. The ancilla transmons 104 and 105 can be controlled to implement rotations of the quantum state of the transmons 104 and 105 themselves. Additionally, the ancilla transmons 104 and 105 can be controlled to interact with the associated cavities 101 and 102, respectively, to implement controlled interactions such as a CPS interaction.

The microwave source 106 may be coupled to the first cavity 101, the second cavity 102, the first ancilla transmon 104, the second ancilla transmon 105, and the coupling transmon 103. The coupling between the microwave source 106 and the other components provides a way for the microwave source to apply microwave radiation to each of the components of the multi-cavity quantum information system 100. In some embodiments, the microwave source 106 may be capacitively coupled to each of the components.

Figure 1B:
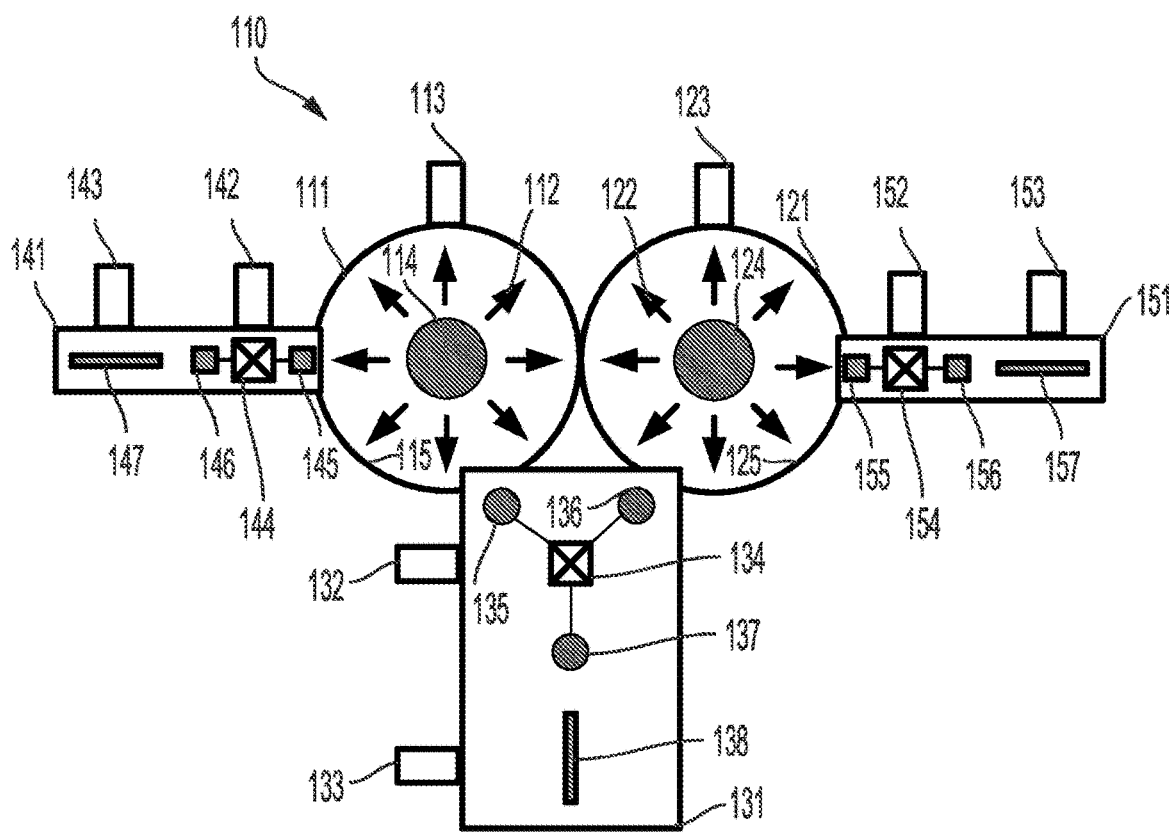
FIG. 1B is a schematic diagram of example cavities and transmons of the multi-cavity quantum information system of FIG. 1A, according to some embodiments.

FIG. 1B is a schematic diagram of a particular example system 110 that may play the role of the multi-cavity quantum information system 100 of FIG. 1A (for simplicity the microwave source 106 is not shown), according to some embodiments. The system 110 includes a first three-dimensional (3D) cavity 111, a second 3D cavity 121, a coupling device 131, a first ancilla device 141, and a second ancilla device 151.

The first and second 3D cavities 111 and 112 acts as a 3D version of a $\lambda/4$ transmission line resonator between a central stubs 114 and 124, respectively, and outer walls 115 and 125, respectively. For example, the diameter of central stubs 114 and 124 may be 3.2 mm and the diameter of the outer walls 115 and 125 may be 9.5 mm. It is noted, however, that embodiments are not limited to any particular dimensions. The resonant frequency of each of the cavities 101 and 102 may be determined by the height of the central stub 114 and 124 within their respective cavity. For example the central stub 114 may have a height of 4.8 mm and the second central stub 124 may have a height of 5.6 mm. The first 3D cavity 111 supports microwave radiation 112 of a first frequency and the second 3D cavity 121 supports microwave radiation 122 of a second frequency that is different from the first frequency. In some embodiments, the first cavity 111 and the second cavity 121 include ports 113 and 123, respectively, through which microwave radiation from the microwave source 106 may be applied. Applying microwave radiation to a cavity may, for example, implement a displacement operation on the quantum state of the cavity.

The coupling device 131 includes a coupling transmon 134 that provides a nonlinear interaction between the first cavity 111 and the second cavity 121. The transmon 134 is coupled to a first antenna 135 that is inserted at least partially into the first cavity 111 and a second antenna 136 that is inserted at least partially into the second cavity 121 such that at least a portion of each antenna protrudes into its respective cavity. The first and second antennas 135/136 may be, for example, circular pads that provide capacitive coupling to the first and second cavities 111/121, respectively.

The coupling device 131 also includes a resonator 138 that provides the ability to readout the state of the transmon 134. A third antenna 137 couples the resonator 138 to the resonator 138. In some embodiments, the resonator 138 is a quasi-planar resonator with a lower Q value than either the first cavity 111 or the second cavity 121. In some embodiments, the transmon 134 and the resonator 134 are fabricated on a single sapphire substrate. A readout pulse of microwave radiation may be received by a pump port 132 and a resulting microwave signal may be received from readout port 133.

The nonlinearity of the transmon 134 of the coupling device 131 enables four wave mixing, which is used to perform a frequency-converting bilinear coupling between the first cavity 111 an the second cavity 121. The four-wave mixing is controlled by pumping the transmon 134 via a pump port 132 with microwave radiation that satisfies the frequency matching condition $\omega_1 - \omega_2 = \omega_{p2} - \omega_{p1}$, where $\omega_1$ is the resonant frequency of the first cavity 111, $\omega_2$ is the resonant frequency of the second cavity 121, $\omega_{p1}$ is the frequency of the first pump associated with a mode c, and $\omega_{p2}$ is the frequency of the second pump associated with a mode d. This coupling implements an effective time-dependent BS interaction between the cavity modes. As is known from conventional optics, the unitary evolution of the beam splitter is described by the unitary operator:

$$U_{BS}(\theta) = e^{-i\int_0^t H_{BS}(\tau)d\tau} = e^{i\theta(a^\dagger b + ab^\dagger)}, \quad (1)$$

where $$H_{BS}(\tau) = g(\tau)(a^\dagger b + ab^\dagger), \quad (2)$$

and $$\theta = \int_0^t g(\tau)d\tau. \quad (3)$$

For $\theta = \pi/2$, the beam splitter unitary operator implements the SWAP operation that exchanges the states between the two cavity modes associated with the annihilation operators a and b, respectively. For $\theta = \pi/4$ and $\theta = -\pi/4$ the unitary operator corresponds to a 50/50 beam splitter. Different from ordinary optics, the microwave cavity eigenmodes have different frequencies and do not couple to each other without a nonlinearity. However, the Josephson nonlinearity and additional parametric pumps can be used to compensate for the cavity frequency difference, so that modes with different frequencies can be coherently coupled. For example, based on the four-mode coupling $g_4 a^\dagger bc^\dagger d + h.c.$ (where h.c. represents the Hermitian conjugate of the first term and $g_4$ is the four mode coupling constant) from the Josephson non-linearity, the modes c and d may be pumped so that they can be approximated by classical coherent states with amplitudes $\langle c \rangle = A_c(\tau)$ and $\langle d \rangle = (\tau)$, which leads to an effective beam-splitter coupling Hamiltonian in Eqn. (2) with $g(\tau) = g_4 A_c^*(\tau) A_d(\tau)$. Note that $g(\tau)$ may be tuned by controlling the amplitudes and phases of $A_c(\tau)$ and $A_d(\tau)$. In this way, some embodiments can easily switch on/off the beam-splitter coupling with extremely high on/off ratio. This is a distinct advantage over 'always-on' capacitive or other fixed couplings between qubits. In addition, by pumping modes c and d so that the sum of their frequencies is equal to the sum of the cavity mode frequencies, one can realize a bi-linear coupling of the form $H_S = f(\tau)a^\dagger b^\dagger + f^*(\tau)ab$. With these two operations one can perform any linear symplectic transformation between the two cavities.

In some embodiments, the above approach of implementing the unitary beam splitter operator using the Josephson non-linearity can be made robust against imperfections in the Josephson device. For example, if the intrinsic non-linearity of the device is weak but the parametric pumping is strong, the effect of thermal noise in modes c and d may be suppressed by the fact that this noise is small relative to the large coherent state amplitudes $A_c$ and $A_d$. Operation in this regime may also increases the linearity of the beam splitter so that SWAP operations can be carried out for quantum states containing a wide range of photon numbers.

The beam splitter unitary transformation is a very useful element for quantum information processing. For example, while evolution of a Gaussian input state (e.g., coherent states, squeezed states) acted upon by the beam splitter unitary operator can be efficiently simulated with a classical computer, evolution of a non-Gaussian input state (e.g., Fock states) may lead to non-trivial output states. For example, the complexity of boson sampling illustrates the non-trivial statistical properties of the output state which are hard to simulate with classical computers. Moreover, the beam splitter unitary combined with both single-photon sources and photon detectors can achieve universal linear optical quantum computation (LOQC), albeit with major challenges that include the probabilistic nature of entangling gates and extremely daunting resource overhead.

In some embodiments, rather than being restricted to linear optical quantum computing, additional nonlinear elements may be used to facilitate quantum information processing. For example, using the physical platform of superconducting circuits with microwave photons not only provides the capabilities of single-photon sources and photon detectors, but also includes at least one highly controllable transmon that can be used as two-level or multi-level ancillae. In some embodiments, quantum operations that combine the beam splitter unitary operator and cavity-transmon dispersive coupling gates are used to perform quantum information processing operations. In some embodiments, the dispersive coupling gates are still linear optics transformations that are controlled by (e.g., based upon and/or conditioned on) the quantum state of a transmon (or other) ancilla. This merging of the capabilities of linear optics and gate-based quantum computation is powerful and allows one to carry out gate operations on qubits logically encoded in photon states in a manner that is independent of the particular logical encoding. Thus, in some embodiments, the logical encoding of the information can be changed while using the same hardware with the same operations.

First ancilla device 141 is similar to the coupling device 131, but only couples to the first cavity 111, not both cavities. The first ancilla device includes a pump port 142 for driving a transmon 144 with pump and readout pulses of microwave radiation and a readout port 143 for receiving readout microwave signals from the transmon 144. The transmon 144 is coupled to the first cavity 111 via a first antenna pad 145 that at least partially protrudes into the first cavity 111. A second antenna pad 146 couples the transmon 144 to a quasi-planar resonator 147.

The second ancilla device 151 is similar to the first ancilla device 141, but is coupled to only the second cavity 121, not the first cavity 111. The second ancilla device includes a pump port 152 for driving a transmon 154 with pump and readout pulses of microwave radiation and a readout port 153 for receiving readout microwave signals from the transmon 154. The transmon 154 is coupled to the first cavity 111 via a first antenna pad 155 that at least partially protrudes into the first cavity 111. A second antenna pad 156 couples the transmon 144 to a quasi-planar resonator 147.

The first and second ancilla devices 141 and 152 may be used to implement a CPS operation, which is represented as:

$$CPS = |g\rangle \langle g| \otimes I + |e\rangle \langle e| \otimes (-1)^{\hat{n}}, \quad (4)$$

where $\hat{n}=a^\dagger a$ is the number operator of the bosonic mode of the particular cavity coupled with the transmon. In some embodiments, the phase shift is $\pi$ and resulting in the implementation of a controlled-Parity operation since the photon number parity operation is $\hat{P}=(-1)^{a^\dagger a}$. In some embodiments, the CPS gate can be obtained from the time evolution under the Hamiltonian with dispersive coupling between the ancilla transmon and the respective cavity $$H_{dis} = \hbar \chi |e\rangle \langle e| \otimes \hat{n} \quad (5)$$

for a time duration $t=\pi/\chi$ and coupling strength $\chi$.

An example set of parameters for implementing the quantum information system 110 is as follows: the first cavity 111 may have a kerr/$2\pi$=2 kHz and $\omega_1/2\pi$=5.45 GHz; the second cavity 121 may have a kerr/$2\pi$=3 kHz and $\omega_2/2\pi$=6.55 GHz; the coupling device 131 may have $\alpha/2\pi$=74 MHz, $\omega/2\pi$=5.95 GHz, $\chi_{c1}/2\pi$=0.26 MHz, and $\chi_{c2}/2\pi$=0.32 MHz; the first ancilla transmon 141 may have $\alpha/2\pi$=180 MHz, $\omega/2\pi$=4.5 GHz, $\chi/2\pi$=0.76 MHz; and the second ancilla transmon 151 may have $\alpha/2\pi$=180 MHz, $\omega/2\pi$=5.0 GHz, $\chi/2\pi$=1.26 MHz.

In some embodiments, a c-SWAP gate may be implemented using a combination of BS operations and CPS operations. A c-SWAP gate operates on two cavity modes and one of the ancilla transmons, swapping the states of the two cavities based on the state of the ancilla transmon. The unitary c-SWAP operator can therefore be written as:

$$U_{cSWAP} = |g\rangle \langle g| \otimes I + |e\rangle \langle e| \otimes SWAP, \quad (6)$$

where $|g\rangle$ and $|e\rangle$ represent the ground state and the first excited state of the ancilla transmon, respectively. Because (c-SWAP)$^2$=I, c-SWAP is reversible. The c-SWAP gate is sometimes called the Fredkin gate, which is universal for classical computation. For quantum computation, c-SWAP and single-qubit rotations form a set of quantum gates capable of universal computation.

Figure 2A:
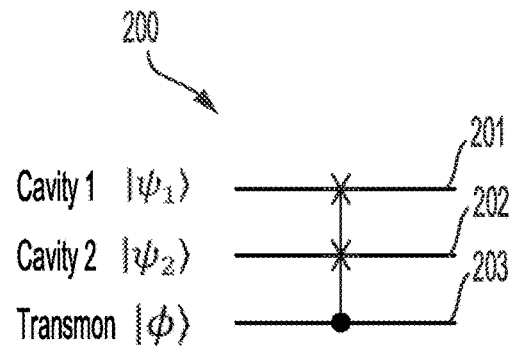
FIG. 2A illustrates a controlled-SWAP (c-SWAP) gate, according to some embodiments.

FIG. 2A illustrates a quantum circuit diagram 200 for a c-SWAP gate. The lines 201, 202, and 203 represent the first cavity 111, the second cavity 121 and an ancilla transmon 131. In quantum circuit diagrams, operations are performed on the various components as a function of time, from left to right. The symbol for the c-SWAP gate includes an "X" at each of the cavity lines 201 and 202 and a dot on the ancilla transmon line 203.

Figure 2B:
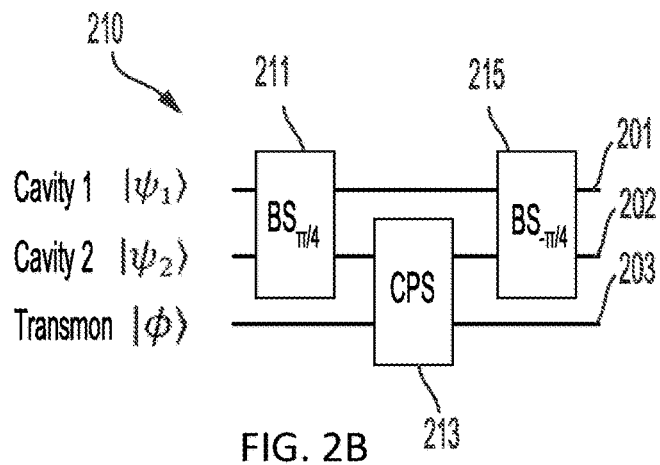
FIG. 2B illustrates a method of implementing the c-SWAP gate of FIG. 2A, according to some embodiments.

FIG. 2B illustrates an example quantum circuit diagram 210 for implementing a c-SWAP gate using BS operations and CPS operations. First, a first BS operation 211 with $\theta=\pi/4$ is performed between the first cavity 201 and the second cavity 202. As described above, the BS operation may be performed using the coupling transmon 134. After the first BS operation 211, a CPS operation 213 between the ancilla transmon 203 and the second cavity 202 is performed. Finally, a second BS operation 215 with $\theta=-\pi/4$ is performed between the first cavity 201 and the second cavity 202.

Figure 2C:
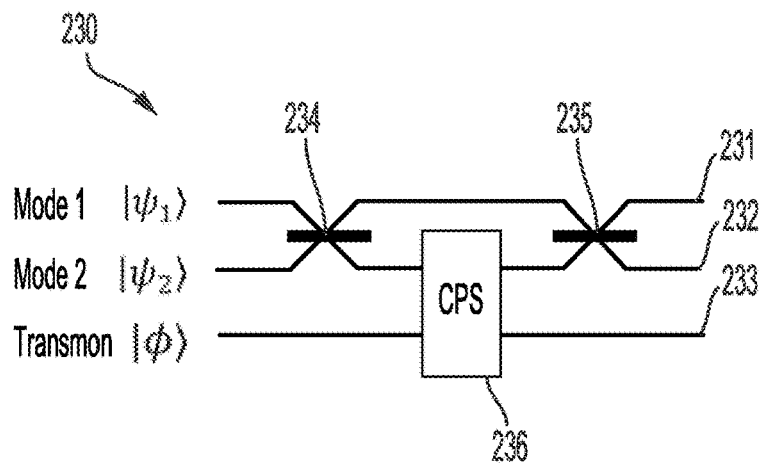
FIG. 2C illustrates a schematic of a c-SWAP gate based on linear optics, according to some embodiments.

As shown in FIG. 2C, the c-SWAP gate can be represented in terms of conventional linear optical diagram with a first optical mode 231 a second optical mode 232 and a transmon 232. The diagram is a Mach-Zehnder interferometer 230 built from a first beam splitter 234, a second beam splitter 235, and a controlled phase shifter 236 that implements a 0 or a $\pi$ phase shift on one arm controlled by the state of the transmon. For transmon state $|g\rangle$, there is a 0 phase shift and thus no exchange of the two bosonic modes. For transmon state $|e\rangle$, there is a $\pi$ phase shift (for each and every excitation coupled with the transmon) leading to full exchange (SWAP) between the two optical modes 231 and 232. Hence, in some embodiments, the c-SWAP can be used as a special quantum-controlled router, which uses a quantum state (e.g., the state of an ancilla transmon) to control the pathway of quantum signals (carried by the optical modes).

In some embodiments, an e-SWAP operation may be performed using a combination of c-SWAP gates and ancilla transmon rotations. The e-SWAP operates on two cavities and is represented by the unitary operator:

$$U_{eSWAP}(\theta) = \exp[i\theta SWAP] = \cos\theta + i\sin\theta SWAP. \quad (7)$$

For $\theta=\pi/2$, an e-SWAP gate is equivalent to a SWAP gate, where the resulting global phase shift (i) is non-observable. For $\theta=\pi/4$, $U_{eSWAP}(\pi/4)=1/\sqrt{2}(I+iSWAP)$ is a coherent combination of the identity operator and the SWAP operator, and is sometimes denoted as $\sqrt{SWAP}$. Single-qubit rotations and the $\sqrt{SWAP}$ operator operating on qubits form a set of universal quantum gates.

There are similarities and differences between the e-SWAP operator and the beam-splitter unitary operator. For the bosonic subspace with zero and one total excitations, the two are equivalent (e.g., $U_{BS}(\theta)|0_a, 1_b\rangle = \cos\theta|0_a, 1_b\rangle + i\sin\theta|1_a, 0_b\rangle = U_{eSWAP}(\theta)|0_a, 1_b\rangle$). However, for the subspace with more than one total excitations, the two operators behave differently $$\left( e.g., U_{BS}(\theta)|1_a, 1_b\rangle = \cos 2\theta|1_a, 1_b\rangle + \frac{i}{\sqrt{2}}\sin 2\theta(|2_a, 0_b\rangle + |0_a, 2_b\rangle) \right),$$

which is distinct from $U_{eSWAP}(\theta)|1_a, 1_b\rangle = |1_a, 1_b\rangle$).

One feature of e-SWAP operator is that it preserves the logical subspace with respect to single-mode bosonic encodings that contain arbitrary numbers of bosons. For logical states of arbitrary single-mode bosonic encoding $|\varphi_1\rangle$, $|\varphi_2\rangle \in \mathcal{H}_C$, the e-SWAP operation $U_{eSWAP}(\theta)|\varphi_1\rangle_a|\varphi_2\rangle_b = \cos\theta|\varphi_1\rangle_a|\varphi_2\rangle_b + i\sin\theta|\varphi_2\rangle_a|\varphi_1\rangle_b$ preserves the code space for any bosonic codes and for any parameter $\theta$. This important property enables one to carry out quantum information processing with different choices of bosonic encoding using the same hardware. This powerful feature gives great flexibility to the hardware and allows experimentation with different encodings for quantum error correction via 'software updates' on fixed hardware.

Figure 3A:
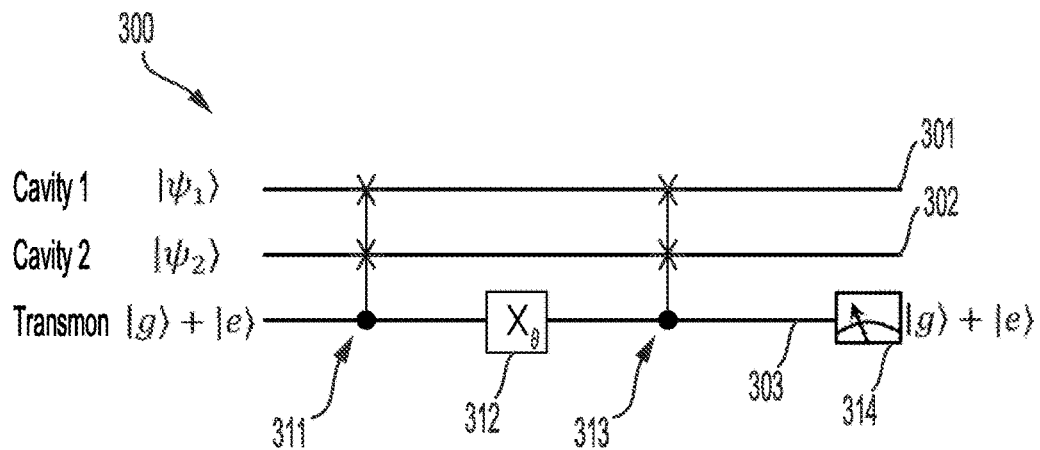
FIG. 3A illustrates an exponential-SWAP (e-SWAP) gate between two cavities, according to some embodiments.

In some embodiments, the e-SWAP operator between two cavity modes can be implemented using a two-level ancilla transmon. For example, FIG. 3A is a quantum circuit diagram 300 between a first cavity 301, a second cavity 302 and an ancilla transmon 303. The illustrated method for implementing the e-SWAP operation is as follows: (1) initialize the ancilla transmon 303 to the quantum state $|+\rangle = 1/\sqrt{2}$ ($|g\rangle + |e\rangle$); (2) perform a first c-SWAP operation 311 between the first cavity 301 and the second cavity 302 controlled based on the state of the ancilla transmon 303; (3) rotate 312 the ancilla transmon 303 by angle $2\theta$ around the X axis $X_\theta = e^{i\theta\sigma_x}$; and (4) perform a second c-SWAP operation 313 between the first cavity 301 and the second cavity 302 controlled based on the state of the ancilla transmon 303. After the foregoing method, the ancilla transmon is restored to the initial state $|+\rangle$ and decoupled from the two cavity modes; meanwhile, the two cavity modes undergo the e-SWAP operation, $U_{eSWAP}(\theta)$. If the ancilla transmon 303 is measured 314, the result, assuming no errors, is the initial state $|+\rangle$.

Figure 3B:
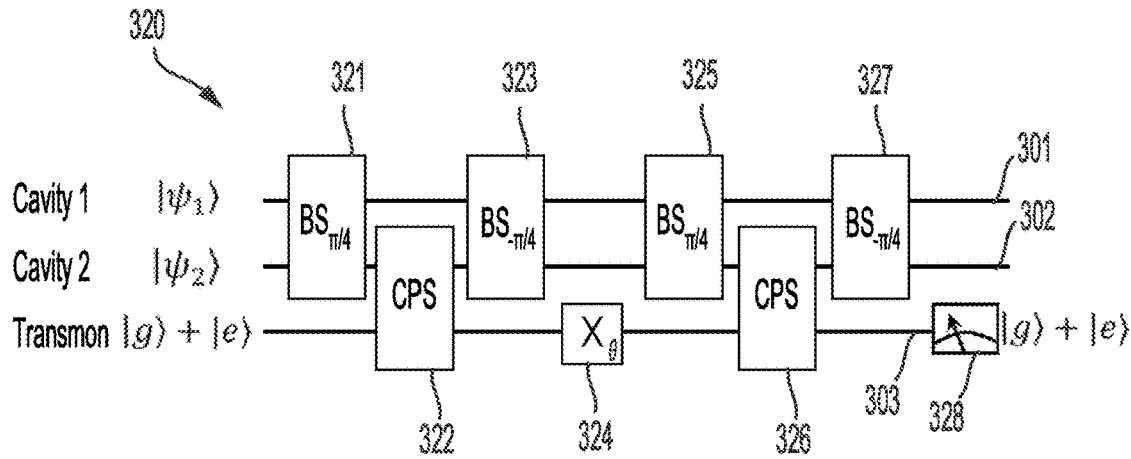
FIG. 3B illustrates a method for implementing the e-SWAP gate of FIG. 3A, according to some embodiments.

FIG. 3B illustrates a quantum circuit diagram 320 for implementing the e-SWAP operation of FIG. 3A using BS operations and CPS operations. In this example, the c-SWAP gates are simply replaced with the c-SWAP method shown in FIG. 2B. Thus, the method of implementing the e-SWAP gate includes: (1) initializing the ancilla transmon 303 to the quantum state $|+\rangle = 1/\sqrt{2}(|g\rangle + |e\rangle)$; (2) performing a first BS operation 321 with $\theta = \pi/4$ between the first cavity 301 and the second cavity 302; (3) performing a first CPS operation 322 between the second cavity 302 and the ancilla transmon 303; (4) performing a second BS operation 323 with $\theta = -\pi/4$ between the first cavity 301 and the second cavity 302; (5) performing a rotation 324 on the ancilla transmon 303 by angle $2\theta$ around the X axis $X_\theta = e^{i\theta\sigma_x}$; (6) performing a third BS operation 325 with $\theta = \pi/4$ between the first cavity 301 and the second cavity 302; (7) performing a second CPS operation 326 between the second cavity 302 and the ancilla transmon 303; (8) performing a fourth BS operation 327 with $\theta = -\pi/4$ between the first cavity 301 and the second cavity 302. As in FIG. 3A, if the ancilla transmon 303 is measured 328, the result, assuming no errors, is the initial state $|+\rangle$.

In some embodiments, a simplified and more robust implementation of the e-SWAP operator can be obtained by decomposing the c-SWAP operators into beam splitter operators and CPS gates in a way that is different from simply substituting the quantum circuit diagram 210 of FIG. 2B into the quantum circuit diagram 300 of FIG. 3A. The simplification of the quantum circuit diagram 320 comes from the realization the two of the beam splitter operations are redundant (e.g., the second and third beam splitter operations 323 and 325) as they cancel each other and can therefore be removed. In addition, the transmon can be initialized in the ground state and additional Hadamard gates can be added to act on the transmon just before the first CPS gate 322 and after the second CPS gate 326, so that the transmon is kept in the ground state during the beam splitter unitary operations.

Figure 3C:
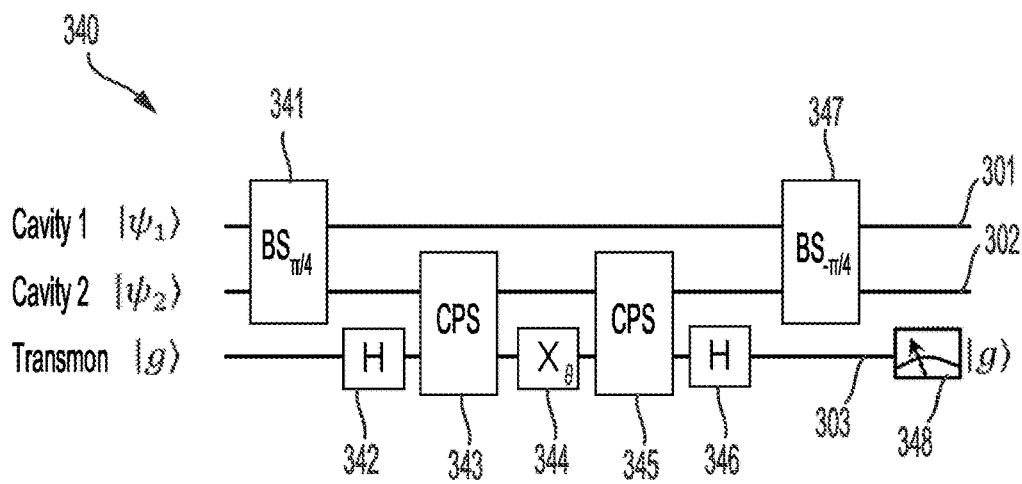
FIG. 3C illustrates a method for implementing the e-SWAP gate of FIG. 3A, according to some embodiments.

With the aforementioned two changes to the quantum circuit, a more robust quantum circuit diagram 340 for the e-SWAP operation is achieved, as illustrated in FIG. 3C. The method of implementing the e-SWAP gate includes: (1) initializing the ancilla transmon 303 to the quantum state $|g\rangle$; (2) performing a first BS operation 341 with $\theta = \pi/4$ between the first cavity 301 and the second cavity 302; (3) performing a first Hadamard operation 342 on the ancilla transmon 303; (4) performing a first CPS operation 343 between the second cavity 302 and the ancilla transmon 303; (5) performing a rotation 344 on the ancilla transmon 303 by angle $2\theta$ around the X axis $X_\theta = e^{i\theta\sigma_x}$; (6) performing a second CPS operation 345 between the second cavity 302 and the ancilla transmon 303; (7) performing a second Hadamard operation 346 on the ancilla transmon 303; (8) performing a second BS operation 347 with $\theta = -\pi/4$ between the first cavity 301 and the second cavity 302. If the ancilla transmon 303 is measured 348, the result, assuming no errors, is the initial state $|g\rangle$.

The simplified quantum circuit diagram 340 include the aforementioned changes because the beam splitter operation may be relatively slow compared to the other operations. Thus, the quantum circuit in FIG. 3C has both a shorter total time duration (which reduces the risk of an error occurring in the cavity states) and a shorter duration for the period in which the ancilla transmon is in the excited state (which reduces the risk of an error occurring on the ancilla). In the quantum circuit designs of FIGS. 3A and 3B, the transmon is never in the ground state, making the transmon vulnerable to decoherence throughout the entire operation, especially during the relatively slow beam splitter unitary operation. In contrast, the quantum circuit diagram 340 of FIG. 3C keeps the transmon in the ground state, except during the relatively fast Hadamard, CPS and $X_\theta$ gates. Therefore, in some embodiments, the quantum circuit design efficiently mitigates imperfections due to transmon decoherence, reducing the error of the overall quantum gate from $O[\gamma_t(t_{BS}+t_{CPS}+t_{Trans})]$ to $O[\gamma_t(t_{CPS}+t_{Trans})]$, where $\gamma_t$ is the transmon decoherence rate, $t_{BS}$, $t_{CPS}$, and $t_{Trans}$ are times associated with the beam splitter, CPS, and transmon rotation gates (e.g., $X_\theta$ and H), respectively. In some embodiments, $t_{BS}(\sim 10 \,\mu s) \gg t_{CPS}(\sim 1 \,\mu s) \gg t_{Trans}(\sim 10 \,ns)$, and making it advantageous to eliminate the vulnerability to transmon decoherence during $t_{BS}$.

Figure 4A:
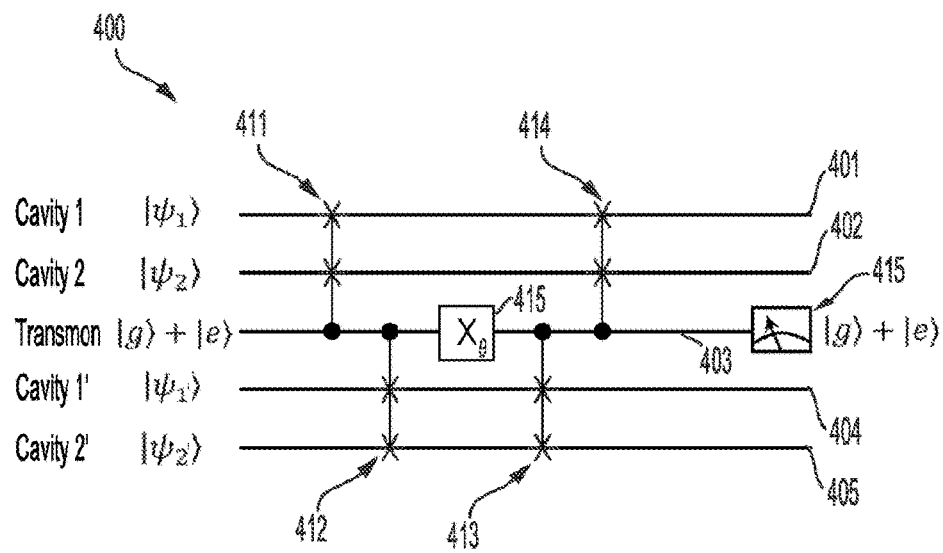
FIG. 4A illustrates an exponential-SWAP (e-SWAP) gate between four cavities, according to some embodiments.

In some embodiments, the e-SWAP operator can be extended to operate over more than two cavities. For example, FIG. 4A illustrates a quantum circuit diagram 400 where an e-SWAP is performed using four cavities with $U_{eSWAP}^{(a,b;a',b')}(\theta) = \exp[i\theta SWAP_{a,b} SWAP_{a',b'}]$. The four-cavity e-SWAP method 400 includes, after initializing the ancilla in the: (1) initializing the ancilla transmon 403 to the quantum state $|+\rangle = 1/\sqrt{2}(|g\rangle + |e\rangle)$; (2) performing a first c-SWAP operation 411 between the first cavity 401 and the second cavity 402 controlled by the state of the ancilla transmon 403; (3) performing a second c-SWAP operation 412 between the third cavity 404 and the fourth cavity 404 controlled by the state of the ancilla transmon 403; (4) performing a rotation 415 on the ancilla transmon 403 by angle $2\theta$ around the X axis $X_\theta = e^{i\theta\sigma_x}$; (5) performing a third c-SWAP operation 413 between the third cavity 404 and the fourth cavity 404 controlled by the state of the ancilla transmon 403; and (6) performing a fourth c-SWAP operation 414 between the first cavity 401 and the second cavity 402 controlled by the state of the ancilla transmon 403. If the ancilla transmon 403 is measured 415, the result, assuming no errors, is the initial state $|+\rangle$.

Figure 4B:
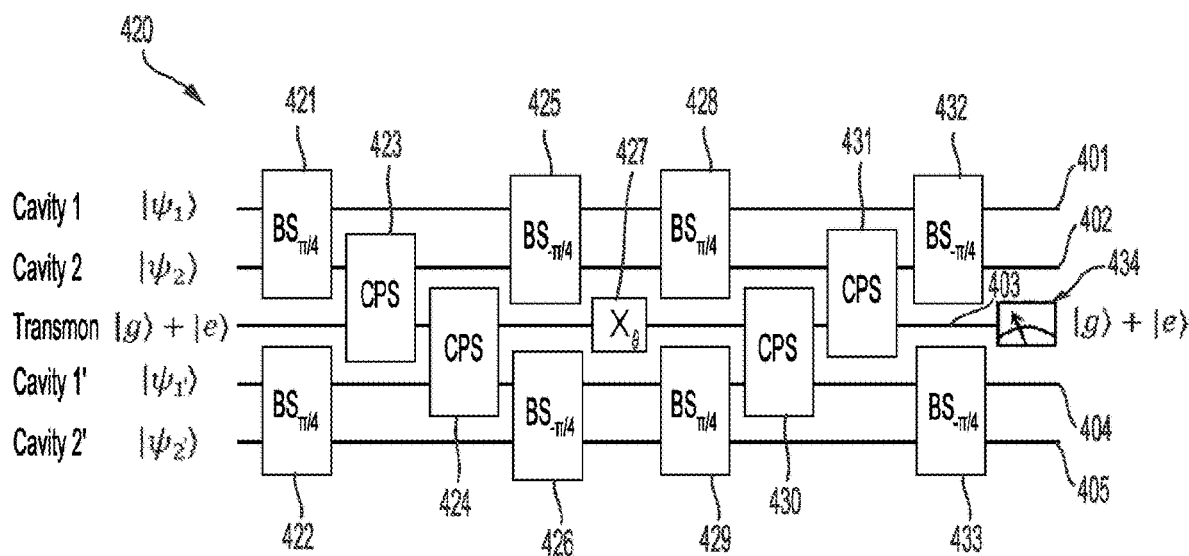
FIG. 4B illustrates a method for implementing the e-SWAP gate of FIG. 4A, according to some embodiments.
Figure 4C:
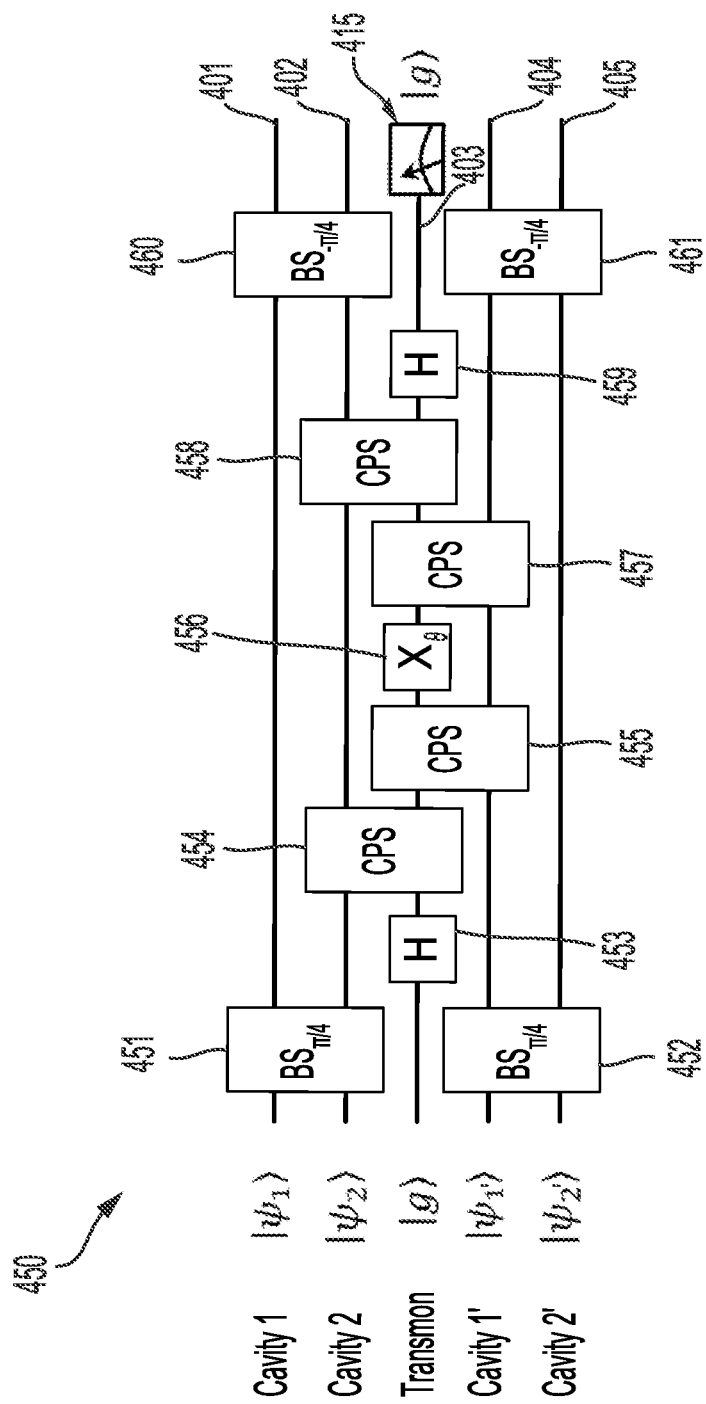
FIG. 4C illustrates a method for implementing the e-SWAP gate of FIG. 4A, according to some embodiments.

Similar to the procedure of FIGS. 3B-C for the e-SWAP between two modes, the e-SWAP operation for four modes can be decomposed into beam splitter operations and CPS gates (FIG. 4B) and converted to a more robust quantum circuit (FIG. 4C). Thus, the method of implementing the e-SWAP gate illustrated by the quantum circuit diagram 420 in FIG. 4B includes: (1) initializing the ancilla transmon 303 to the quantum state $|+\rangle=1/\sqrt{2}(|g\rangle+|e\rangle)$; (2) performing a first BS operation 421 with $\theta=\pi/4$ between the first cavity 401 and the second cavity 402; (3) performing a second BS operation 422 with $\theta=\pi/4$ between the third cavity 404 and the fourth cavity 405; (4) performing a first CPS operation 423 between the second cavity 402 and the ancilla transmon 403; (5) performing a second CPS operation 423 between the third cavity 404 and the ancilla transmon 403; (6) performing a third BS operation 425 with $\theta=\pi/4$ between the first cavity 401 and the second cavity 402; (7) performing a fourth BS operation 426 with $\theta=\pi/4$ between the third cavity 404 and the fourth cavity 405; (8) performing a rotation 427 on the ancilla transmon 403 by angle $2\theta$ around the X axis $X_\theta=e^{i\theta\sigma_x}$; (9) performing a fifth BS operation 428 with $\theta=\pi/4$ between the first cavity 401 and the second cavity 402; (10) performing a sixth BS operation 429 with $\theta=\pi/4$ between the third cavity 404 and the fourth cavity 405; (11) performing a third CPS operation 430 between the third cavity 404 and the ancilla transmon 403; (12) performing a fourth CPS operation 431 between the second cavity 402 and the ancilla transmon 403; (13) performing a seventh BS operation 432 with $\theta=-\pi/4$ between the first cavity 401 and the second cavity 402; (7) performing a eighth BS operation 433 with $\theta=-\pi/4$ between the third cavity 404 and the fourth cavity 405. If the ancilla transmon 403 is measured 415, the result, assuming no errors, is the initial state $|+\rangle$.

It should be noted that not all operations have to be performed in the order shown. For example, the first BS operation 421 and the second BS operation 422 are illustrated to be performed at the same time. In some embodiments, either BS operation may be performed before the other. The same is true for the third BS operation 425 and the fourth BS operation 426; the fifth BS operation 428 and the sixth BS operation 429; and the seventh BS operation 432 and the eighth BS operation 433. Also, the first CPS operation 423 is illustrated as occurring before the second CPS operation 424. In some embodiments, the second CPS operation 424 may be performed before the first CPS operation 423. Similarly, the fourth CPS operation 431 may be performed before the third CPS operation 430.

Following the example of simplifying the quantum circuit diagram of FIG. 3C and making the method more robust to errors, the quantum circuit diagram 450 of FIG. 4C includes: (1) initializing the ancilla transmon 303 to the quantum state $|g\rangle$; (2) performing a first BS operation 451 with $\theta=\pi/4$ between the first cavity 401 and the second cavity 402; (3) performing a second BS operation 452 with $\theta=\pi/4$ between the third cavity 404 and the fourth cavity 405; (4) performing a first Hadamard operation 453 on the ancilla transmon 403; (5) performing a first CPS operation 454 between the second cavity 402 and the ancilla transmon 403; (6) performing a second CPS operation 455 between the third cavity 404 and the ancilla transmon 403; (7) performing a rotation 456 on the ancilla transmon 403 by angle $2\theta$ around the X axis $X_\theta=e^{i\theta\sigma_x}$; (8) performing a third CPS operation 457 between the third cavity 404 and the ancilla transmon 403; (9) performing a fourth CPS operation 458 between the second cavity 402 and the ancilla transmon 403; (10) performing a second Hadamard operation 459 on the ancilla transmon 403; (11) performing a third BS operation 460 with $\theta=\pi/4$ between the first cavity 401 and the second cavity 402; (12) performing a fourth BS operation 461 with $\theta=\pi/4$ between the third cavity 404 and the fourth cavity 405. If the ancilla transmon 403 is measured 415, the result, assuming no errors, is the initial state $|g\rangle$.

It should be noted that not all operations have to be performed in the order shown. For example, the first BS operation 451 and the second BS operation 452 are illustrated to be performed at the same time. In some embodiments, either BS operation may be performed before the other. The same is true for the third BS operation 460 and the fourth BS operation 461. Also, the first CPS operation 454 is illustrated as occurring before the second CPS operation 455. In some embodiments, the second CPS operation 455 may be performed before the first CPS operation 454. Similarly, the fourth CPS operation 458 may be performed before the third CPS operation 457.

Returning now to the quantum circuit diagram 340 of FIG. 3C, the presence of dephasing and decay errors are discussed. Since $t_{CPS}\gg t_{Trans}$, the focus is on transmon errors during the two CPS gates, while neglecting the errors during $X_\theta$.

In some embodiments, the quantum circuit diagram 340 for the e-SWAP operation illustrated in FIG. 3C can herald transmon dephasing errors, which occur with a dephasing rate $\gamma_\varphi$. The transmon dephasing error in the g-e subspace can be characterized by the quantum channel $$\mathcal{E}_\varphi(\rho)=(1-\epsilon_\varphi)\rho+\epsilon_\varphi\sigma_Z\rho\sigma_Z, \quad (8)$$

where $\epsilon_\varphi=\frac{1}{2}(1-e^{-\gamma_\varphi t_{CPS}})$ for transmon dephasing error probability during each CPS gate and $\tau_Z=|g\rangle\langle g|-|e\rangle\langle e|$ for $\pi$ relative phase jump between the $|g\rangle$ and $|e\rangle$ states. Transmon dephasing during either of the two CPS gates results in a measured $|e\rangle$ state for the transmon at the measurement 348, which is orthogonal to $|g\rangle$ and can be detected without ambiguity. Hence, in some embodiments, any first-order (i.e. single-occurrence) transmon dephasing errors during the CPS gates are detected, though as noted above, which of the two errors occurred cannot be determined and, therefore, the errors are only heralded and cannot be corrected.

In some embodiments, additional levels of the ancilla transmon, beyond the ground state $|g\rangle$ and the first excited state $|e\rangle$, may be used to improve the robustness of the e-SWAP operation. For example, first-order errors associated with spontaneous decay of the transmon state may be both heralded and corrected. In some embodiments, the cavity-transmon coupling Hamiltonian is altered to be "error transparent", so that the leading order error of transmon decay commutes with the error transparent Hamiltonian for all logical states of the cavities. The transmon decay that occurred during the evolution can then be identified as the transmon decay that occurred at the end of the evolution, which can significantly simplify the error analysis.

Figure 5A:
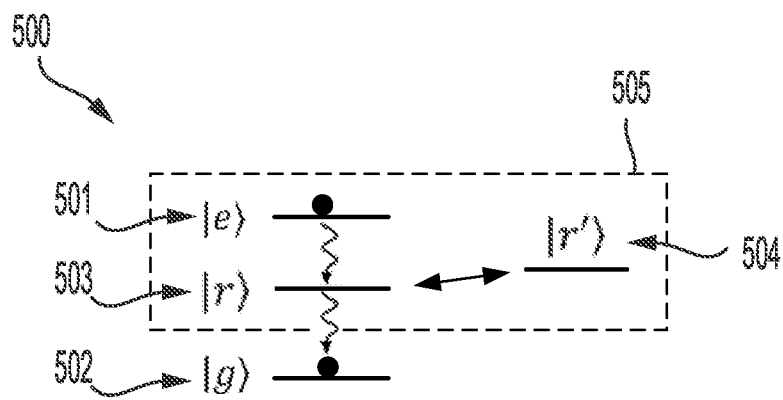
FIG. 5A illustrates a four-level transmon energy structure, according to some embodiments.

In some embodiments, four transmon levels ($|g\rangle$, $|r\rangle$, $|r'\rangle$, $|e\rangle$) are used, where the $|g\rangle-|e\rangle$ subspace is used to encode a qubit of information, while the $|r\rangle-|r'\rangle$, |subspace is used to detect errors. FIG. 5A illustrates an energy level diagram 500 for the transmon. The state $|e\rangle$ 501 represents some higher excited level (e.g., higher than the first excited state), that does not directly decay to state $|g\rangle$ 502, but decays to state $|r\rangle$ 503 as a leading decay error. By introducing additional levels, the transmon decay error from the $|g\rangle-|e\rangle$ subspace can be characterized by the quantum channel $$\varepsilon(\rho)=\Sigma_{j=0,1,\ldots}K_j\rho K_j^\dagger, \quad (9)$$

where $K_0=|g\rangle\langle g|+\sqrt{1-e^{-\gamma_1 t_{CPS}}}|e\rangle\langle e|$ and $K_1=e^{-\gamma_1 t_{CPS}/2}|r\rangle\langle e|$. The subspace spanned by $|g\rangle-|e\rangle$ is used to encode the qubit, whereas the subspace spanned by $|e\rangle$, $|r\rangle$, and $|r'\rangle$ has uniform strength of dispersive coupling with the cavity mode.

In some embodiments, a quantum circuit similar to the circuit shown in FIG. 3C is used, but the unitary operations are generalized to the four-level transmon. In some embodiments, controllable back-action to the cavity modes is controlled by engineering the dispersive coupling between the transmon and cavity $$H_{dis}=h_\chi(|e\rangle\langle e|+|r\rangle\langle r|+|r'\rangle\langle r'|)\otimes\hat{n}, \quad (10)$$

to have identical dispersive shift $\chi$ for states $|e\rangle$, $|r\rangle$, and $|r'\rangle$, so that the CPS gate is $$CPS=|g\rangle\langle g|\otimes I+(|e\rangle\langle e|+|r\rangle\langle r|+|r'\rangle\langle r'|)\otimes(-1)^{\hat{n}}. \quad (11)$$

In some embodiments, the unitary operator associated with a generalized Hadamard gate becomes $$H|g\rangle=(|g\rangle+|e\rangle)/\sqrt{2}$$

$$H|e\rangle=(|g\rangle-|e\rangle)/\sqrt{2}$$

$$H|r\rangle=|r\rangle$$

$$H|r'\rangle=|r'\rangle. \quad (12)$$

Thus, the Hadamard rotation is performed within the g-e subspace and acts trivially over the r-r' subspace.

In some embodiments, the transmon rotation becomes $$X_\theta|g\rangle=\cos\theta|g\rangle+i\sin\theta|e\rangle$$

$$X_\theta|e\rangle=i\sin\theta|g\rangle+\cos\theta|e\rangle$$

$$X_\theta|r\rangle=|r'\rangle$$

$$X_\theta|r'\rangle=|r\rangle, \quad (13)$$

which rotates within the g-e subspace and swaps states $|r\rangle$ and $|r'\rangle$.

In some embodiments, the CPS operation becomes $$CPS|g\rangle=|g\rangle\otimes(+1)^{\hat{n}}$$

$$CPS|e\rangle=|e\rangle\otimes(-1)^{\hat{n}}$$

$$CPS|r\rangle=|r\rangle\otimes(-1)^{\hat{n}}$$

$$CPS|r'\rangle=|r'\rangle\otimes(-1)^{\hat{n}}. \quad (14)$$

With the above extended gates over the four-level transmon, it is possible to detect first-order transmon dephasing errors and correct first-order transmon decay errors.

Transmon decay during the first CPS operation 343 results in measurement 348 of $|r'\rangle$ for the transmon state, while the cavity modes continue to evolve under the CPS gate without error because the decay does not change the dispersive coupling. Transmon decay during the second CPS operation 345 results in measurement of $|r\rangle$ for the transmon state, while the cavity modes evolve as the desired $U_{eSWAP}(\theta)$. Because the transmon decay errors ($|r'\rangle$ and $|r\rangle$ states associated with transmon decay during the first and second CPS gates, respectively) can be unambiguously distinguished, the first-order transmon decay errors during the CPS gates can be actively corrected in some embodiments.

In some embodiments, three transmon levels ($|g\rangle$, $|r\rangle$, $|e\rangle$) may be used by collapsing the r-r' subspace to a single state $|r\rangle$ and reducing the operations within the r-r' manifold to trivial operation on state $|r\rangle$ (e.g., $X_\theta|r\rangle=|r\rangle$). In some embodiments, such a detection scheme can also detect transmon thermal heating (e.g., $|g\rangle\to|r\rangle$). A three-level transmon ancilla mode is therefore sufficient to achieve detection of first-order transmon dephasing/decay/heating errors during the CPS gates.

Figure 5B:
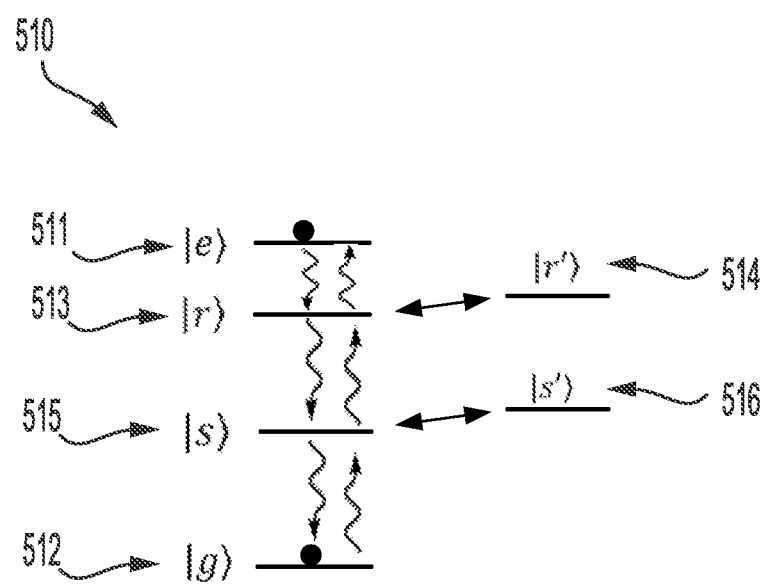
FIG. 5B illustrates a six-level transmon energy structure, according to some embodiments.

In some embodiments, both decay and heating errors of the transmon are corrected by deploying additional transmon levels. For example, six transmon levels 511-516 ($|g\rangle$, $|e\rangle$, $|r\rangle$, $|r'\rangle$, $|s\rangle$, $|s'\rangle$) with decay transitions shown in the energy level diagram 510 of FIG. 5B and dispersive coupling in Eqn. (10) can be used. In some embodiments, a qubit of information is encoded in the g-e subspace. Based on a measurement of the transmon state resulting in $|r'\rangle$ or $|r,\rangle$ a transmon decay error during the first or second CPS gates can be corrected. Based on a measurement of the transmon state of $|s'\rangle$ or $|s\rangle$, a transmon heating error during the first or second CPS gates can be corrected.

Some embodiments use the above-discussed techniques in a variety of applications. Such as a quantum router, quantum RAM, quantum state comparison, quantum principal component analysis, or universal quantum computing.

In a modular architecture for information processing, routers play an indispensable role in connecting different modules and different components within a module. There are many different types of routers for classical and quantum information processing. As listed in Table 1, routers may be classified based on the classical/quantum (C/Q) nature of the input signals and control signals. Different types of routers and example associated applications. A classical-classical router is simply a classical switch. A classical-quantum router sends quantum information to a classical address. A quantum-quantum router sends quantum information to a quantum superposition of addresses. The quantum-classical router sends classical information to a quantum address. However since the information is classical the quantum state collapses so that only one address receives the classical signal. This is what happens in a quantum measurement where a semi-classical 'meter' is entangled with a quantum state and the state 'collapses' when the meter is 'read'

TABLE 1

| Control\Input | Classical | Quantum |
|---|---|---|
| Classical | C-C Router (e.g., classical switch) | C-Q Router (e.g., quantum network) |
| Quantum | Q-C Router (e.g., quantum measurement) | Q-Q Router (e.g., quantum RAM) |

In some embodiments, a Q-Q router is implemented using the c-SWAP operation by: (1) storing quantum input and control signals in the cavity and transmon modes, respectively, (2) applying the c-SWAP operation over the cavity modes conditioned on the transmon modes, and (3) retrieving the quantum signals from the cavity and transmon modes.

In some embodiments, the c-SWAP operation can be used to implement a quantum Random Access Memory (RAM). The quantum RAM can perform memory accesses using a coherent quantum superposition of addresses. To build an efficient quantum RAM, a Q-Q router with a three-level (transmon) memory (labeled "0", "L", and "R") and three cavity modes (labeled "input", "left", and "right") is used. The (transmon) memory is initialized in the "0" state, and all three cavities are initialized in the vacuum $|vac\rangle$ state. The goal of the Q-Q router is to process or route the quantum signal(s), which can be a superposition of three possible states: vacuum $|vac\rangle$, left $|L\rangle$, or right $|R\rangle$.

In some embodiments, a Q-Q router has five different function settings: (1) idle, (2) store control signal, (3) route signal forward, (4) route signal backward, and (5) retrieve control signal. Note that steps (2) & (3) can be used to carve out the pathway towards the target memory, while steps (4) and (5) can be used for the inverse unitary to decouple the quantum RAM.

In some embodiments, the operation of each of these five function settings is as follows:

(1) When the Q-Q router idles, no operation need to be applied.

(2) To store a control signal, the Q-Q router stores the incoming control signal in the input cavity, and then transfers the control signal from the input cavity to the transmon mode.

(3) To route the signal forward, the Q-Q router stores the signal in the input cavity temporarily. Then, conditioned on the (transmon) memory being in the state "0", "L", or "R", the Q-Q router guides the quantum signal (via c-SWAP operations) to the "input", "left", or "right" cavity, respectively. Finally, the Q-Q router releases the signal from the "left" and "right" cavities to allow it to move on to the next stage.

(4) To route the signal backward, the Q-Q router performs the reverse operation of (3). For example, the Q-Q router stores the incoming signal to the "left" and "right" cavities. Then, conditioned on the (transmon) memory states "0", "L", or "R", the Q-Q router guides the quantum signal (via c-SWAP operations) from the "input", "left", or "right" cavity to the "input" cavity, respectively. Finally, the Q-Q router retrieves the signal from the input cavity.

(5) To receive the control signal, the Q-Q router performs the reverse operation of (2). For example, the Q-Q router transfers the control signal from the (transmon) memory to the input cavity, and then retrieves the signal from the input cavity.

In some embodiments, the c-SWAP operation can be used to estimate the overlap of two quantum states. For example, if the transmon is initialized in the state $|g\rangle+|e\rangle$ and the quantum state for two subsystems (cavities) are represented by the density matrices $\rho^A$ and $\rho^B$, the initial input state is:

$$(|g\rangle+|e\rangle)(\langle g|+\langle e|)\otimes\rho^A\otimes\rho^B. \quad (15)$$

After the c-SWAP operation, the state becomes:

$$|g\rangle\langle g|\otimes\rho^A\otimes\rho^B+|g\rangle\langle e|\otimes[(\rho^A\otimes\rho^B)\text{SWAP}_{AB}]+|e\rangle$$
$$\langle g|\otimes[\text{SWAP}_{AB}(\rho^A\otimes\rho^B)]+|e\rangle\langle e|\otimes[\text{SWAP}_{AB}$$
$$(\rho^A\otimes\rho^B)\text{SWAP}_{AB}], \quad (16)$$

with reduced density matrix taking the form $$\rho_{transmon}=|g\rangle\langle g|+|g\rangle\langle e|Tr\rho^A\rho^B+|e\rangle\langle g|Tr\rho^A\rho^B+|e\rangle\langle e| \quad (17)$$

where we have used the property $$Tr[(\rho^A\otimes\rho^B)SWAP_{AB}] = Tr[(\rho^A_{i,j}\otimes\rho^B_{k,l})\delta_{i,l}\delta_{j,k}] \quad (18)$$
$$= \sum_{i,j}\rho^A_{i,j}\rho^B_{j,i}$$
$$= Tr\rho^A\rho^B$$
$$= Tr\rho^B\rho^A.$$

Thus, in some embodiments, by measuring the phase coherence (e.g., Ramsey fringe contrast) of $\rho_{transmon}$, the overlap $O(\rho^A,\rho^B)\equiv Tr\rho^A\rho^B$, which is always a real number, can be extracted.

In some embodiments, the transmon is projectively measured in the $|g\rangle\pm|e\rangle$ basis. If the transmon is measured as $|g\rangle+|e\rangle$, the two subsystems are projected to the symmetric subspace (i.e., the eigen-subspace with eigenvalue+1 for the SWAP operator), $$\rho_{A,B}{}^{(+)}=\Pi_+(\rho^A\otimes\rho^B)\Pi_+, \quad (19)$$

where $\Pi_+$ is a projection operator. If the transmon is measured in $|g\rangle-|e\rangle$, the two subsystems are projected to the anti-symmetric subspace (i.e., the eigen-subspace with eigenvalue −1 for the SWAP operator), $$\rho_{A,B}{}^{(-)}=\Pi_-(\rho^A\otimes\rho^B)\Pi_-, \quad (20)$$

where projection operator $\Pi_-=1-\Pi_+$. A subsequent measurement should give the same outcome, which is consist with the quantum non-demolition nature of these measurements.

Figure 6:
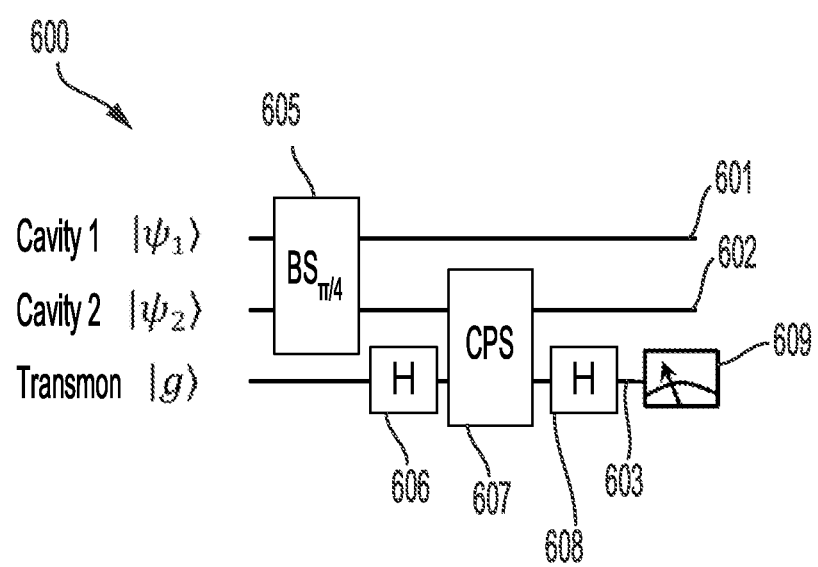
FIG. 6 illustrates a method of performing quantum state comparison, according to some embodiments.

In some embodiments, a more robust quantum circuit 600 acting on a first cavity 601, a second cavity 602, and a transmon 603, as illustrated in FIG. 6, for the purpose of quantum state comparison includes the following modifications: (1) remove the second beam-splitter (See FIG. 2B) that is dispensable for the purpose of quantum state comparison; (2) initialize the transmon in $|g\rangle$ and rotate to $|g\rangle+|e\rangle$ right before the CPS gate to avoid the transmon decoherence during the first beam-splitter operation. The simplified circuit 600 minimizes the use of the beam splitter operation and decoherence of the transmon probe and includes: (1) a first beam splitter operation 605 between the first cavity 601 and the second cavity 602; (2) a first Hadamard operation 606 on the transmon 603; (3) a CPS operation 607 between the second cavity 602 and the transmon 603; (4) a second Hadamard operation 608 on the transmon 603; and (5) a measurement 609 of the transmon 603 state. Note that the simplified circuit can also be interpreted as the parity measurement of the second cavity mode after the beam-splitter operation. This interpretation can be easily justified based on the property of the projection operator to the symmetric subspace $\Pi_+$, which is spanned by the symmetric states $(a^\dagger-b^\dagger)^{2n}(a^\dagger+b^\dagger)^m|vac\rangle$ with non-negative integers n, m (similarly, the anti-symmetric subspace $\Pi_-$ is spanned by the anti-symmetric states $(a^\dagger-b^\dagger)^{2n+1}(a^\dagger+b^\dagger)^m|vac\rangle$. Recall that after the 50/50 beam splitter, $a^\dagger\pm b^\dagger$ correspond to the creation operators of the first and second cavity modes, respectively. Therefore, the symmetric states always have 2n even excitations in the second cavity mode, while the antisymmetric states always have 2n+1 odd excitations.

For each of $\rho^A$ and $\rho^B$, a binary outcome 0 or 1 associated with the transmon measurement is obtained. N∼$\epsilon^{-2}$ pairs of $\rho^A$ and $\rho^B$ are needed to reliably estimate the overlap $O(\rho^A,\rho^B)$ with precision $\epsilon$.

In some embodiments, an e-SWAP operation is used to perform quantum principal component analysis (qPCA), which may be used to perform machine learning from large data sets. More specifically, qPCA can reveal the largest eigenvalues of an ensemble of identically prepared density matrices. The key idea is to use the following property of e-SWAP $$Tr_\rho e^{-iSWAP\Delta t}(\rho\otimes\sigma)e^{iSWAP\Delta t}=\sigma-i\Delta t[\rho,\sigma]+O(\Delta t^2)\approx e^{-i\rho\Delta t}\sigma e^{i\rho\Delta t}, \quad (21)$$

which effectively simulates the Hamiltonian evolution with Hamiltonian being the Hermitian density matrix H=ρ for small duration Δt. With n identical copies of the density matrix ρ, one can construct $e^{-i\rho n\Delta t}\sigma e^{i\rho n\Delta t}$. In some embodiments, together with a quantum phase estimation algorithm, the phase associated with the largest few eigenvalues of the density matrix ρ can be efficiently estimated. The e-SWAP gate according to some embodiments herein will enable the physical implementation for the key step of the qPCA.

In some embodiments, the e-SWAP gate is used to achieve universal quantum computing with bosonic systems, which can be compatible with arbitrary single-mode bosonic encoding (denoted as $|\bar{0}\rangle$ and $|\bar{1}\rangle$). For example, if one encodes one logical qubit using four such bosonic modes, with quad-rail logical qubit basis as $$|0_Q\rangle = \tfrac{1}{2}(|\tilde{0}\tilde{1}\rangle + |\tilde{1}\tilde{0}\rangle)_{1,2} \otimes (|\tilde{0}\tilde{1}\rangle - |\tilde{1}\tilde{0}\rangle)_{3,4}$$

$$|1_Q\rangle = \tfrac{1}{2}(|\tilde{0}\tilde{1}\rangle - |\tilde{1}\tilde{0}\rangle)_{1,2} \otimes (|\tilde{0}\tilde{1}\rangle + |\tilde{1}\tilde{0}\rangle)_{3,4}, \quad (22)$$

where the sub-indices label the modes. Since $|\tilde{0}\tilde{1}\rangle \pm |\tilde{1}\tilde{0}\rangle$ are respectively eigenstates of the SWAP operator with eigenvalues ±1, the quad-rail logical Z-rotation is the e-SWAP operation $$Z_Q(\theta) = \exp[-i\theta\text{SWAP}_{1,2}] = \exp[i\theta\text{SWAP}_{3,4}]. \quad (23)$$

In addition, we have $\text{SWAP}_{1,3}\text{SWAP}_{2,4}|0_Q\rangle = |1_Q\rangle = X_Q|0_Q\rangle$, which implies that the quad-rail logical X-rotation is a four-mode e-SWAP operation $$X_Q(\theta) = \exp[-i\theta\text{SWAP}_{1,3}\text{SWAP}_{2,4}]. \quad (24)$$

Finally, the controlled-Z gate between the two encoding quad-rail logical qubits is another four-mode e-SWAP operation $$CZ(\theta) = \exp[-i\theta\text{SWAP}_{1,2}\text{SWAP}_{1',2'}], \quad (25)$$

where the sub-indices 1' and 2' label the first two bosonic modes from the other quad-rail logical qubit. Given an arbitrary logical Z- and X-rotations and controlled-Z gate, it is sufficient to achieve arbitrary universal quantum computation. Because the above gates do not depend on the details of the choice of orthogonal basis $|\tilde{0}\rangle$ and $|\tilde{1}\rangle$, this scheme can work for any single-mode bosonic encoding, including a cat code, a binomial code, a GKP code, etc. Therefore, the aforementioned robust design of e-SWAP implementations (see FIG. 4C) is sufficient to implement the key ingredients for universal quantum computation.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method for implementing a quantum logic gate between a plurality of cavities comprising a first cavity and a second cavity, the method comprising:
   performing a first beam splitter (BS) operation between the first cavity and the second cavity using a coupling transmon that is dispersively coupled to both the first cavity and the second cavity; and
   performing a controlled phase shift (CPS) operation between the second cavity and an ancilla transmon that is dispersively coupled to the second cavity but not dispersively coupled to the first cavity.

2. The method of claim 1, further comprising performing a second BS operation between the first cavity and the second cavity using the coupling transmon, wherein the first BS operation is performed before the CPS operation and the second BS operation is performed after the CPS operation.

3. The method of claim 2, wherein the quantum logic gate comprises a controlled-SWAP (c-SWAP) operation.

4. The method of claim 3, wherein the quantum logic gate comprises an exponential-SWAP (e-SWAP) gate and the method comprises:
performing a first c-SWAP operation between the first cavity and the second cavity;
performing a second c-SWAP operation between the first cavity and the second cavity; and
performing a rotation operation on the ancilla transmon between the first c-SWAP operation and the second c-SWAP operation.

5. The method of claim 2, wherein the quantum logic gate comprises an exponential-SWAP (e-SWAP) gate, the CPS operation is a first CPS operation and the method comprises:
performing a second CPS operation between the second cavity and the ancilla transmon after the first CPS operation and before the second BS operation; and
performing a rotation operation on the ancilla transmon between the first CPS operation and the second CPS operation.

6. The method of claim 5, further comprising:
performing a first Hadamard operation before the first CPS operation and after the first BS operation; and
performing a second Hadamard operation after the second CPS operation and before the second BS operation.

7. The method of claim 6, further comprising measuring the ancilla transmon.

8. The method of claim 7, further comprising determining that a dephasing error a dephasing error occurred based on a result of measuring the ancilla transmon.

9. The method of claim 7, wherein:
at least four energy levels of the ancilla transmon are used;
a first energy level of the ancilla transmon is associated with a first decay error type;
a second energy level of the ancilla transmon is associated with a second decay error type; and
the method further comprises correcting for decay errors based on a result of measuring the ancilla transmon.

10. The method of claim 1, wherein at least one local quantum logic gate is performed on the ancilla transmon before and/or after the CPS operation.

11. The method of claim 10, wherein:
the at least one local quantum logic gate comprises a first Hadamard operation performed after the BS operation and before the CPS operation; and
the method further comprises measuring the state of the ancilla transmon to compare the a first quantum state of the first cavity to a second quantum state of the second cavity.

12. The method of claim 2, wherein:
the plurality of cavities further comprises a third cavity and a fourth cavity;
the coupling transmon is a first coupling transmon;
the ancilla transmon is dispersively coupled to the third cavity by not dispersively coupled to the fourth cavity;
the CPS operation is a first CPS operation; and
the method further comprises:
performing a third BS operation between the third cavity and the fourth cavity using a second coupling transmon that is dispersively coupled to both the third cavity and the fourth cavity; and
performing a second CPS operation between the third cavity and the ancilla transmon.

13. The method of claim 12, wherein the method further comprises:
performing a fourth BS operation between the third cavity and the fourth cavity using the second coupling transmon, wherein the fourth BS operation is performed before the second CPS operation and the second BS operation is performed after the second CPS operation;
performing a third CPS operation between the third cavity and the ancilla transmon after the second CPS operation and before the fourth BS operation;
performing a rotation operation on the ancilla transmon between the second CPS operation and the third CPS operation; and
performing a fourth CPS operation between the second cavity and the ancilla transmon after the third CPS operation and before the second BS operation.

14. The method of claim 13, wherein the method further comprises:
performing a first Hadamard operation before the first CPS operation and after the first and third BS operations; and
performing a second Hadamard operation after the fourth CPS operation and before the second and fourth BS operations.

15. A multi-cavity quantum information system comprising:
a first cavity configured to support microwave radiation;
a second cavity configured to support microwave radiation;
a first transmon dispersively coupled to the first cavity;
a second transmon dispersively coupled to the second cavity;
a third transmon dispersively coupled to both the first cavity and the second cavity; and
a microwave source configured to:
apply microwave radiation to the third transmon to implement beam splitter operations between the first cavity and the second cavity and transmon rotation operations, and
apply microwave radiation to the first transmon and the second transmon to implement controlled phase shift operations on the first cavity and the second cavity, respectively.

16. The multi-cavity quantum information system of claim 15, wherein the microwave source is further configured to apply microwave radiation to the first transmon and the second transmon to implement arbitrary rotation operation on the first transmon and the second transmon, respectively.

17. The multi-cavity quantum information system of claim 16, wherein the microwave source is further configured to apply microwave radiation to the first, second and third transmon to implement a set of universal quantum gates between the first cavity and the second cavity.

18. The multi-cavity quantum information system of claim 15, wherein the microwave source is further configured to apply microwave radiation to the first, second and third transmon to implement a controlled-SWAP gate between the first cavity and the second cavity.

19. The multi-cavity quantum information system of claim 15, wherein the microwave source is further configured to apply microwave radiation to the first, second and third transmon to implement an exponential-SWAP gate between the first cavity and the second cavity.

20. The multi-cavity quantum information system of claim 15, wherein the microwave source is further configured to:
- apply microwave radiation to the first and/or second transmon to measure the first and/or second transmon; and
- apply microwave radiation to the first, second, and/or third transmon to implement a quantum gate based on a result of measuring the first and/or second transmon.

* * * * *